United States Patent
Kim et al.

(10) Patent No.: US 8,809,888 B2
(45) Date of Patent: Aug. 19, 2014

(54) LIGHT EMITTING ELEMENT WITH IMPROVED LIGHT EXTRACTION EFFICIENCY, LIGHT EMITTING DEVICE COMPRISING THE SAME, AND FABRICATING METHOD OF THE LIGHT EMITTING ELEMENT AND THE LIGHT EMITTING DEVICE

(71) Applicant: Samsung Electronics Co., Ltd., Suwon-si (KR)

(72) Inventors: Yu-Sik Kim, Suwon-si (KR); Seong-Deok Hwang, Seoul (KR); Seung-Jae Lee, Cheonan-si (KR); Sun-Pil Youn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/800,188

(22) Filed: Mar. 13, 2013

(65) Prior Publication Data
US 2013/0193474 A1   Aug. 1, 2013

Related U.S. Application Data

(63) Continuation of application No. 13/343,147, filed on Jan. 4, 2012, now Pat. No. 8,415,181, which is a continuation of application No. 12/586,970, filed on Sep. 30, 2009, now Pat. No. 8,110,843.

(30) Foreign Application Priority Data

Oct. 1, 2008   (KR) .................. 10-2008-0096685

(51) Int. Cl.
  *H01L 33/00*   (2010.01)
(52) U.S. Cl.
  USPC ................... 257/98; 257/99; 257/E33.067

(58) Field of Classification Search
  USPC .................................... 257/E33.067
  See application file for complete search history.

(56) References Cited

U.S. PATENT DOCUMENTS

| 6,362,496 B1 | 3/2002 | Nanishi et al. |
| 7,429,750 B2 * | 9/2008 | Suehiro et al. .................. 257/53 |

(Continued)

FOREIGN PATENT DOCUMENTS

| JP | 2004-55816 | 2/2004 |
| KR | 10-0489042 | 5/2005 |

(Continued)

OTHER PUBLICATIONS

"Light Emitting Element With Mproved Light Extraction Efficiency, Light Emitting Device Comprising the Same, and Fabricating Method of the Light Emitting Element and the Light Emiting Device" Specification, Drawings, Claims and Prosecution History, of U.S. Appl. No. 12/586,970, filed Sep. 30, 2009, by Yu-Sik Kim, et al.

(Continued)

*Primary Examiner* — Thien F Tran
(74) *Attorney, Agent, or Firm* — Onello & Mello, LLP

(57) ABSTRACT

Provided is a light emitting element, a light emitting device including the same, and fabrication methods of the light emitting element and light emitting device. The light emitting device comprises a substrate, a light emitting structure including a first conductive layer of a first conductivity type, a light emitting layer, and a second conductive layer of a second conductivity type which are sequentially stacked, a first electrode which is electrically connected with the first conductive layer; and a second electrode which is electrically connected with the second conductive layer and separated apart from the first electrode, wherein at least a part of the second electrode is connected from a top of the light emitting structure, through a sidewall of the light emitting structure, and to a sidewall of the substrate.

18 Claims, 22 Drawing Sheets

(56) References Cited

U.S. PATENT DOCUMENTS

| | | |
|---|---|---|
| 7,858,999 B2 | 12/2010 | Horng et al. |
| 8,110,843 B2 | 2/2012 | Kim et al. |
| 2009/0039371 A1 | 2/2009 | Kim et al. |
| 2009/0194779 A1 | 8/2009 | Yoon |
| 2010/0078670 A1 | 4/2010 | Kim et al. |
| 2010/0237361 A1* | 9/2010 | Sakai et al. ............ 257/88 |
| 2010/0308357 A1 | 12/2010 | Horie et al. |
| 2012/0107988 A1 | 5/2012 | Kim et al. |

FOREIGN PATENT DOCUMENTS

| | | |
|---|---|---|
| KR | 10-2006-0134491 | 12/2006 |
| KR | 10-0721158 | 5/2007 |

OTHER PUBLICATIONS

"Light Emitting Element With Mproved Light Extraction Efficiency, Light Emitting Device Comprising the Same, and Fabricating Method of the Light Emitting Element and the Light Emiting Device" Specification, Drawings, Claims and Prosecution History, of U.S. Appl. No. 13/343,147, filed on Jan. 4, 2012, by Yu-Sik Kim, et al.

* cited by examiner

LIGHT EMITTING ELEMENT WITH IMPROVED LIGHT EXTRACTION EFFICIENCY, LIGHT EMITTING DEVICE COMPRISING THE SAME, AND FABRICATING METHOD OF THE LIGHT EMITTING ELEMENT AND THE LIGHT EMITTING DEVICE

CROSS REFERENCE TO RELATED APPLICATION

This application is a continuation application of U.S. patent application Ser. No. 13/343,147, filed on Jan. 4, 2012, which is continuation application of U.S. patent application Ser. No. 12/586,970, filed on Sep. 30, 2009, now U.S. Pat. No. 8,110,843, which claims priority from Korean Patent Application No. 10-2008-0096685 filed on Oct. 1, 2008, in the Korean Intellectual Property Office, the contents of which applications are incorporated herein in their entirety by reference.

BACKGROUND OF THE INVENTION

1. Field of the Invention

The present invention relates to a light emitting element, a light emitting device including the same, and fabrication methods of the light emitting element and light emitting device.

2. Description of the Related Art

A light emitting element such as a LED (Light Emitting Diode) emits light by combination of electrons and holes. Such a light emitting element has small power consumption, long life span, can be installed in a limited space, and has strong characteristics against vibration.

SUMMARY OF THE INVENTION

An important consideration in light emitting elements is improvement in light extraction efficiency. The light extraction efficiency indicates the ratio of light emitted to the exterior (for example, air or transparent resin surrounding the light emitting element) to light generated from the interior of the light emitting element. The optical refractive index of a light emitting element can be, for example, about 2.2 to about 3.8, the optical refractive index of air is 1, and the optical refractive index of a transparent resin can be 1.5. For example, if the optical refractive index of the light emitting element is 3.4, a critical angle when light generated from the inside of the light emitting element exits to air is about 17°, and the critical angle when light exits to the transparent resin can be about 26°. In this case, the optical refractive index when light generated from the inside of the light emitting element exits to air is about 2.2% and the optical refractive index when light exits to the transparent resin is about 4%. Thus, a very small amount of light generated from the inside of the light emitting element exits to the outside. The remaining light is reflected from a surface of the light emitting element and is contained inside the light emitting element.

The present invention provides a light emitting element and a light emitting device with improved light extraction efficiency.

The present invention also provides fabrication methods of the light emitting element and the light emitting device with improved light extraction efficiency.

According to an aspect of the present invention, there is provided a light emitting element comprising: a substrate; a light emitting structure including a first conductive layer of a first conductivity type, a light emitting layer, and a second conductive layer of a second conductivity type which are sequentially stacked; a first electrode which is electrically connected with the first conductive layer; and a second electrode which is electrically connected with the second conductive layer and separated apart from the first electrode. At least a part of the second electrode is connected from a top of the light emitting structure, through a sidewall of the light emitting structure, and to a sidewall of the substrate. According to another aspect of the present invention, there is provided a light emitting element comprising: a substrate; a light emitting structure including a first conductive layer of a first conductivity type, a light emitting layer, and a second conductive layer of a second conductivity type which are sequentially stacked, wherein the width of the first conductive layer is larger than the width of the second conductive layer and the width of the light emitting layer and the first conductive layer protrudes on sides more than the second conductive layer or the light emitting layer; a first electrode which is electrically connected with the first conductive layer and formed on a protruding region of the first conductive layer; and a second electrode which is electrically connected with the second conductive layer, separated apart from the first electrode, and surrounding the first electrode.

According to an aspect of the present invention, there is provided a light emitting device comprising one of the light emitting elements described above.

According to another aspect of the present invention, there is provided a method of fabricating a light emitting element, the method comprising: forming a groove in a substrate to define a device formation region; forming a light emitting structure including a first conductive layer of a first conductivity type, a light emitting layer, and a second conductive layer of a second conductivity type which are sequentially stacked on the device formation region, wherein the width of the first conductive layer is larger than the width of the second conductive layer and the light emitting layer, and the first conductive layer protrudes on sides more than the second conductive layer or the light emitting layer; forming a first electrode which is electrically connected with the second conductive layer and connected from a top of the light emitting structure, through a sidewall of the light emitting structure, and to a sidewall of the groove; removing a part of the first electrode to expose a part of a region where the first conductive layer protrudes; and forming a second electrode which is electrically connected with the first conductive layer on the exposed first conductive layer.

According to an aspect of the present invention, there is provided a method of fabricating a light emitting device, the method using one of the methods of fabricating a light emitting element described above.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative teams, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Figure 1:
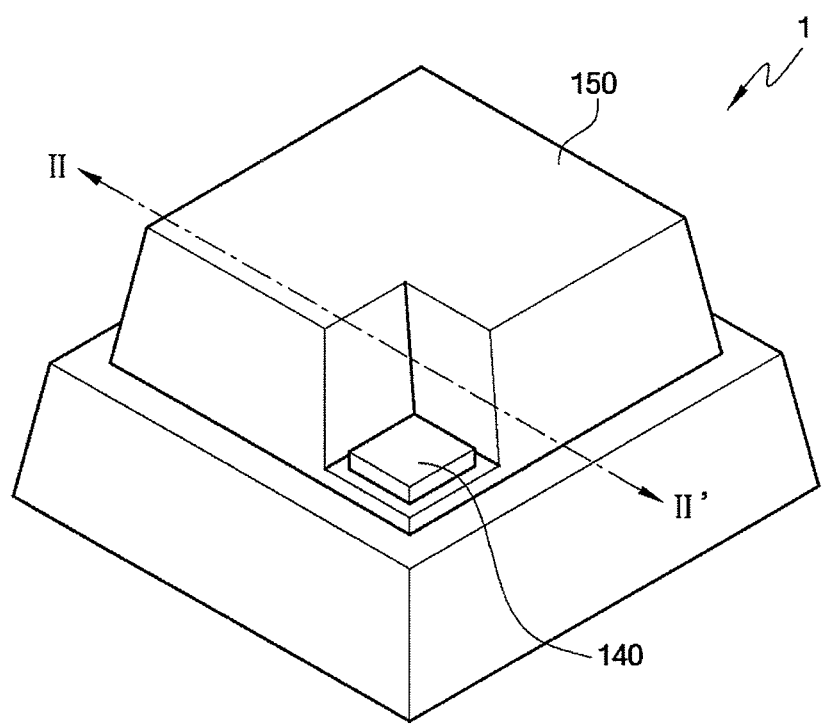
FIG. 1 is a perspective view illustrating a light emitting element according to a first exemplary embodiment of the present invention.
Figure 2:
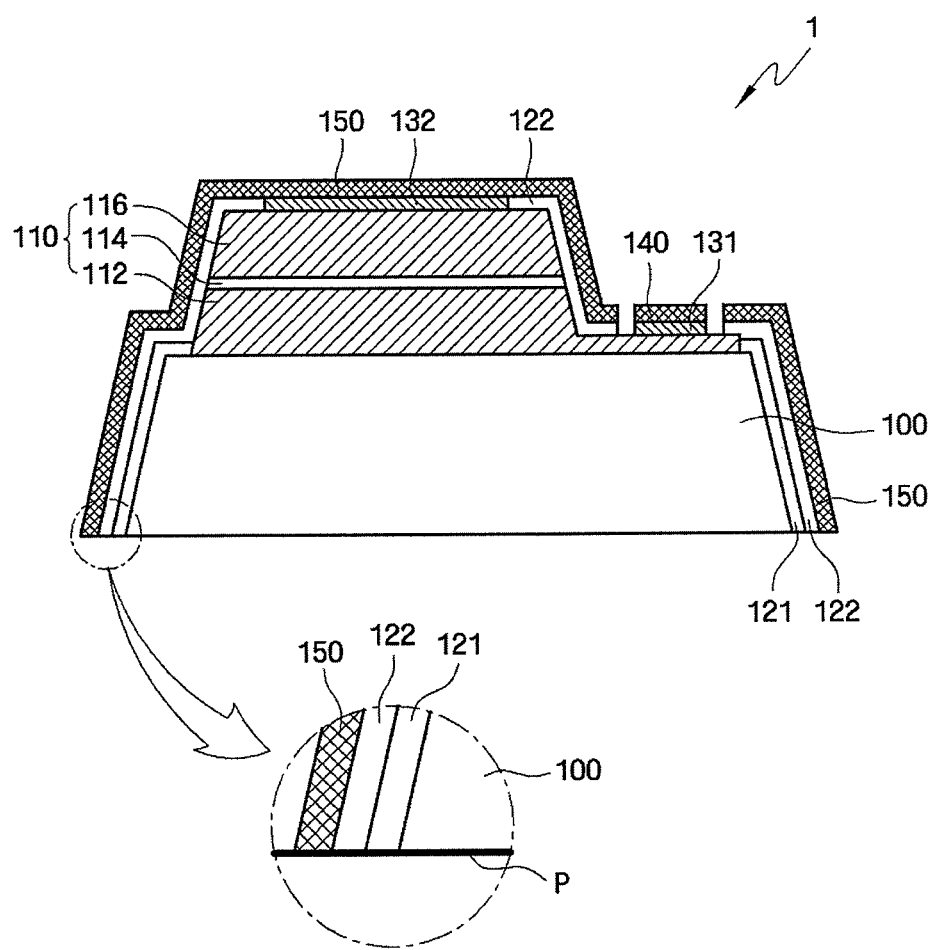
FIG. 2 is a sectional view taken along a line II-II+ of FIG. 1.
Figure 3:
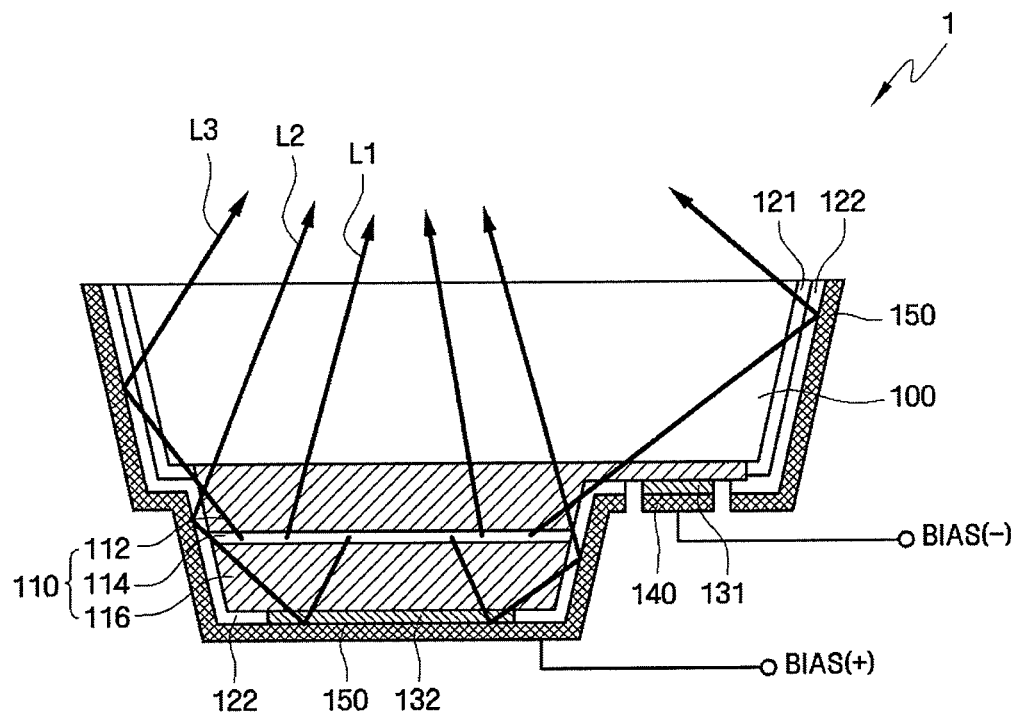
FIG. 3 is a sectional view illustrating operation of the light emitting element according to the first exemplary embodiment of the present invention.

FIGS. 1 through 3 are drawings illustrating a light emitting element according to a first exemplary embodiment of the present invention. Specifically, FIG. 1 is a perspective view illustrating a light emitting element according to a first exemplary embodiment of the present invention. FIG. 2 is a sectional view taken along a line II-II' of FIG. 1. FIG. 3 is a sectional view illustrating operation of the light emitting element according to the first exemplary embodiment of the present invention. The light emitting element according to the first exemplary embodiment of the present invention is a flip chip type of light emitting element.

Referring to FIGS. 1 and 2, a light emitting element 1 according to the first exemplary embodiment of the present invention includes a substrate 100 and a light emitting structure 110 comprising a first conductive layer 112 of a first conductivity type, a light emitting layer 114, and a second conductive layer 116 of a second conductivity type which are sequentially stacked and formed on the substrate 100. Also, the light emitting element 1 includes a first electrode 140 which is electrically connected to the first conductive layer 112 and a second electrode 150 which is electrically connected to the second conductive layer 116.

The first conductive layer 112, the light emitting layer 114, and the second conductive layer 116 can include $In_xAl_yGa_{(1-x-y)}N$ ($0 \le x \le 1$, $0 \le y \le 1$) (i.e., various materials including GaN). Thus, the first conductive layer 112, the light emitting layer 114, and the second conductive layer 116 can be, for example, AlGaN or InGaN.

The first conductive layer 112 is of the first conductivity type (for example, n-type), and the second conductive layer 116 is of the second conductivity type (for example, p-type). However, depending on design methods, the first conductive layer 112 can be of the second conductivity type (for example, p-type), and the second conductive layer 116 can be of the first conductivity type (for example, n-type).

The light emitting layer 114 is a region where carriers of the first conductive layer 112 (for example, electrons) and carriers of the second conductive layer 116 (for example, holes) are combined to generate light. Although not specifically illustrated in the drawing, the light emitting layer 114 can include a well layer and a barrier layer. Since the well layer has a smaller band gap than that of the barrier layer, carriers (electrons, holes) are gathered in the well layer and combined. Depending on the number of well layers, the light emitting layer 114 can include a Single Quantum Well (SQW) structure and a Multiple Quantum Well (MQW) structure.

The SQW structure includes a single well layer and the MQW structure includes multiple well layers. To control light emitting characteristics, at least one of B, P, Si, Mg, Zn, Se, and Al can be doped into at least one of the well layer or the barrier layer.

As illustrated in FIG. 2, since the width of the first conductive layer 112 is larger than the width of the second conductive layer 116 and the light emitting layer 114, the first conductive layer 112 can protrude on sides. (i.e., the first conductive layer 112 can protrude more than the second conductive layer 116 or the light emitting layer 114.)

A first dielectric layer 121 can be formed conformally on the sidewalls of the substrate 100. A second dielectric layer 122 is formed conformally along the profile of the light emitting structure 110, and it is patterned to expose part of the first conductive layer 112 (part of region where the first conductive layer 112 protrudes) and part of the second conductive layer 116. Also, the first dielectric layer 122 can be formed on the first dielectric layer 121. Thus, on the sidewalls of the substrate 100 two layers of the dielectric layer 121 and 122 are formed, and on sidewalls of the light emitting structure 110 one layer of the dielectric layer 122 can be formed.

The first dielectric layer 121 and the second dielectric layer 122 can include a silicon oxide layer, a silicon nitride layer, an aluminum oxide layer, or an aluminum nitride layer. The first dielectric layer 121 and the second dielectric layer 122, for example, can be formed using PECVD (Plasma Enhanced Chemical Vapor Deposition), thermal oxidation, electron beam deposition, or sputtering.

On the first conductive layer 112 exposed by the second dielectric layer 122, a first ohmic layer 131 and the first electrode 140 are formed. On the second conductive layer 116 exposed by the second dielectric layer 122, a second ohmic layer 132 and the second electrode 150 can be formed. In particular, part of the second electrode 150 can be connected from the top of light emitting structure 110, through the sidewalls of the light emitting structure 110, to the sidewalls of the substrate 100. Thus, the second electrode 150 can be formed conformally along the profiles of the light emitting structure 110 and the substrate 100. Also, as illustrated in FIG. 2, the light emitting structure 110 or the substrate 100 can have a side slope since the bottom width is larger than the top width. Thus, since the second electrode 150 is formed conformally along the profile of the light emitting structure 110 and the substrate 100, the second electrode 150 formed on the light emitting structure 110 and the second electrode 150 formed on the substrate 100 can have side slopes. As described in detail below in connection with FIG. 3, the second electrode 150 formed in such way serves as a reflector and allows light generated in the light emitting structure 110 to be reflected by the second electrode 150 and exit outside easily.

Also, the second electrode 150 is separated from the first electrode 140, and can surround the first electrode 140. Since the second electrode 150 is formed not only on the sidewalls of the light emitting structure 110 but also on the sidewalls of the substrate 100, the second electrode 150 surrounds the first electrode 140.

Each of the first ohmic layer 131 and the second ohmic layer 132 can include at least one of indium tin oxide (ITO), zinc (Zn), zinc oxide (ZnO), silver (Ag), titanium (Ti), aluminum (Al), gold (Au), nickel (Ni), indium oxide ($In_2O_3$), tin oxide ($SnO_2$), copper (Cu), tungsten (W), and platinum (Pt). Each of the first electrode 140 and the second electrode 150 can include at least one of silver (Ag), aluminum (Al), Indium Tin Oxide (ITO), copper (Cu), nickel (Ni), chrome (Cr), gold (Au), titanium (Ti), platinum (Pt), vanadium (V), tungsten (W), and molybdenum (Mo). In particular, for the second electrode 150 silver (Ag) and aluminum (Al) having high reflection characteristics can be used.

When the light emitting structure 110 is formed on one side of the substrate (i.e., the top side in FIG. 2), the other side of the substrate 100 and a part of the second electrode 150 can be positioned on a same plane P. Such a structure, as described in detail below, is used to facillitate a grinding process when dividing the substrate in chip unit; however, the invention is not limited thereto.

The substrate 100 can be made of any material that can grow the first conductive layer 112, the light emitting layer 114, and the second conductive layer 116. For example, the substrate 100 can be a dielectric substrate such as sapphire ($Al_2O_3$) and zinc oxide (ZnO) or can be a conductive substrate such as silicon (Si) and silicon carbide (SiC).

Also, although not illustrated in the drawings, on the surface of the second conductive layer 116, texture patterns can be formed. If the texture patterns are formed, more light can exit the light emitting structure 110, and as a result light extraction efficiency can be improved. Although not illustrated in the drawings, a buffer layer can be formed between the substrate 100 and the first conductive layer 112. The buffer layer serves as a seed layer when growing the first conductive layer 112. The buffer layer can be formed with any material that can serve as a seed layer and, for example, can be $In_xAl_yGa(1-x-y)N (0 \leq x \leq 1, 0 \leq y \leq 1)$ and $Si_xC_yN(1-x-y)$ $(0 \leq x \leq 1, 0 \leq y \leq 1$.

Also, although it is illustrated that two layers of the dielectric layers 121 and 122 are formed on the sidewalls of the substrate 100 and one layer of the dielectric layer 122 is formed on the sidewall of the light emitting structure 110, it is not limited thereto. For example, n layers (n is a natural number greater than 1) of dielectric layers can be formed between the side of substrate 100 and the second electrode 150, and m layers (m is a natural number smaller than n) of dielectric layer can be formed between the sidewall of the light emitting structure 110 and the second electrode 150.

Referring to FIG. 3, operation of the light emitting element 1 according to a first exemplary embodiment is described.

If the first conductive layer 112 is n-type and the second conductive layer 116 is p-type, first bias BIAS (−) is applied to the first conductive layer 112 through the first electrode 140 and the first ohmic layer 131, and second bias BIAS (+) is applied to the second conductive layer 116 through the second electrode 150 and the second ohmic layer 132. On the contrary, if the second conductive layer 116 is n-type and the first conductive layer 112 is p-type, the second bias BIAS (+) is applied to the first conductive layer 112 through the first electrode 140 and the first ohmic layer 131 and the first bias BIAS (−) is applied to the second conductive layer 116 through the second electrode 150 and the second ohmic layer 132.

When bias is applied as described above, a forward bias is applied to the light emitting structure 110. Due to the forward bias, light L1, L2, and L3 is generated from the light emitting layer 114. Part of the light L1 can exit without reflection, part of the light L2 can exit due to the reflection from the second electrode 150 formed on the sidewall of the light emitting structure 110, and part of the light L3 can exit due to the reflection from the second electrode 150 formed on the sidewall of the substrate 100.

As described previously, light generated from the light emitting structure 110 can be locked inside, and the second electrode 150 which serves as a reflector allows light to exit easily. Thus, although light generated from the light emitting structure 110 (for example, like L1) cannot exit directly, the possibility of exiting can be higher when reflected by the second electrode 150 several times. As a result, light extraction efficiency can be higher. In particular, the light emitting element 1 according to the first exemplary embodiment of the present invention can further increase light extraction efficiency since the second electrode 150 is formed along the sidewall of the substrate 100.

Figure 4:
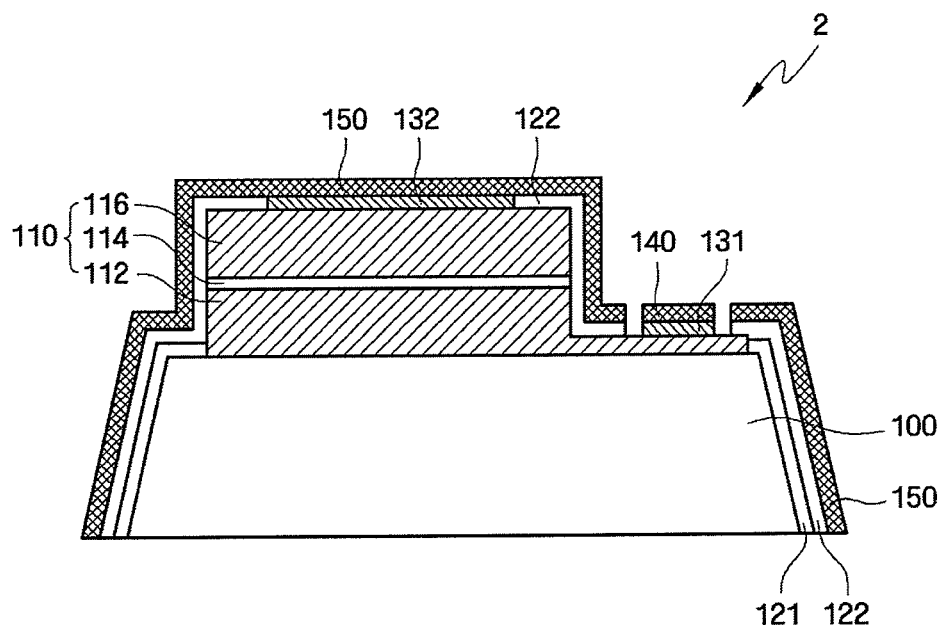
FIG. 4 is a sectional view illustrating a light emitting element according to a second exemplary embodiment of the present invention.

FIG. 4 is a sectional view illustrating a light emitting element according to a second exemplary embodiment of the present invention.

Referring to FIG. 4, a difference between a light emitting element 2 according to the second exemplary embodiment of the present invention and the first exemplary embodiment is that the light emitting element 2 according to the second exemplary embodiment has a slope on a sidewall of a substrate 100 and no slope on a sidewall of a light emitting structure 110.

Although not illustrated in the drawings, it is possible that the light emitting structure 110 has a sidewall slope and the substrate 100 has no sidewall slope. Also, neither the light emitting structure 110 nor the substrate 100 can have a sidewall slope.

Figure 5:
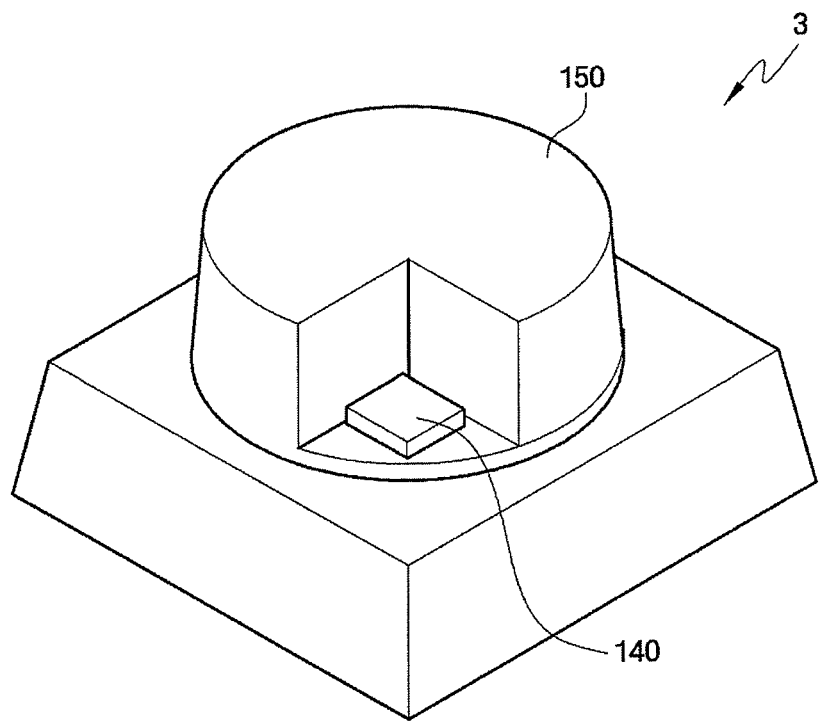
FIG. 5 is a perspective view illustrating a light emitting element according to a third exemplary embodiment of the present invention.

FIG. 5 is a perspective view illustrating a light emitting element according to a third exemplary embodiment of the present invention.

Referring to FIG. 5, the difference between a light emitting element 3 according to the third exemplary embodiment of the present invention and the first exemplary embodiment is that in the light emitting element 3 according to the third exemplary embodiment, a light emitting structure 110 is formed in a cylinder shape.

Figure 6:
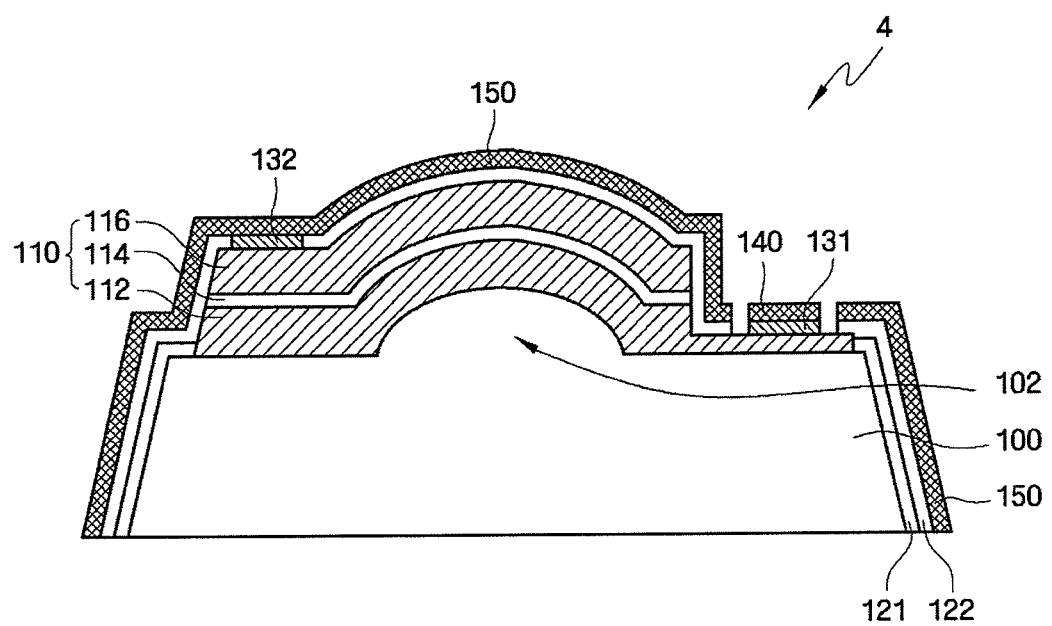
FIG. 6 is a sectional view illustrating a light emitting element according to a fourth exemplary embodiment of the present invention.

FIG. 6 is a sectional view illustrating a light emitting element according to a fourth exemplary embodiment of the present invention.

Referring to FIG. 6, the difference between a light emitting element 4 according to the fourth exemplary embodiment of the present invention and the first exemplary embodiment is that in the light emitting element 4 according to the fourth exemplary embodiment, a dome pattern 102 is formed on a substrate 100, and a light emitting structure 110 is formed conformally along the dome pattern 102.

Specifically, as illustrated in the drawing, the dome pattern 102 can be a convex dome shape; however, it is not limited thereto. Also, as illustrated in the drawing, although only one dome pattern 102 is shown to be formed on the substrate 100, the invention is not limited thereto. Thus, several dome patterns can be formed. Also, the width of the dome pattern 102 can be between about 100 μm and about 1000 μm. For example, the width can be about 300 μm which is about the size of a small chip.

In particular, in the light emitting element 4 according to the fourth exemplary embodiment, the light emitting structure 110 is formed conformally along the dome pattern 102 described previously, i.e, the light emitting structure 110 can be formed in an arch shape.

If the light emitting structure 110 is formed conformally along the dome pattern 102 to have a curve shape, a large amount of light generated from the light emitting structure 110 can be perpendicular to the surface of the light emitting structure 110. Thus, a large amount of light generated from the light emitting structure 110 can exit easily. Thus, light extraction efficiency can be improved.

Figure 7:
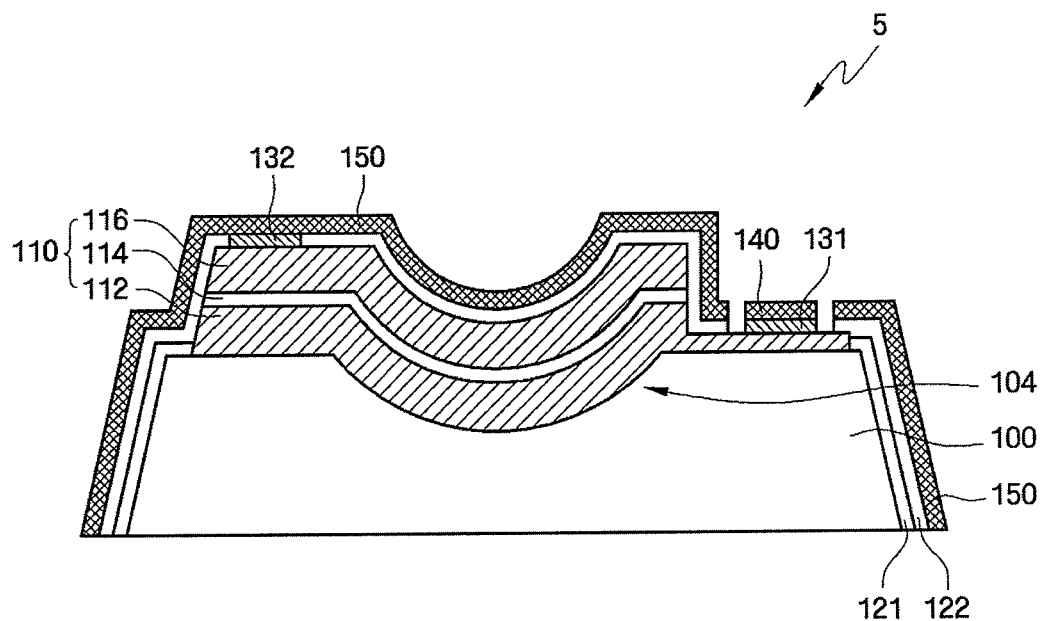
FIG. 7 is a sectional view illustrating a light emitting element according to a fifth exemplary embodiment of the present invention.

FIG. 7 is a sectional view illustrating a light emitting element according to a fifth exemplary embodiment of the present invention.

Referring to FIG. 7, a dome pattern 104 used in a light emitting element 5 according to the fifth exemplary embodiment of the present invention can be a concave dome type (inverted dome type). A light emitting structure 110 is formed conformally along the dome pattern 104.

Also, as illustrated in the drawing, although only one dome pattern 104 is shown to be formed on a substrate 100, the invention is not limited thereto. Thus, several dome patterns can be formed. Also, the width of the dome pattern 104 can be between about 100 μm and about 1000 μm. For example, the width can be about 300 μm which is about the size of a small chip.

If the light emitting structure 110 is formed conformally along the dome pattern 104 to have a curve shape, a large amount of light generated from the light emitting structure 110 can be perpendicular to the surface of the light emitting structure 110. Thus, a large amount of light generated from the light emitting structure 110 can exit easily. Thus, light extraction efficiency can be improved.

Hereinafter, a light emitting device fabricated by using the light emitting elements 1 through 5 is described. To aid understanding, a light emitting device using the light emitting element 1 according to the first exemplary embodiment of the present invention is illustrated; however, the present invention is not limited thereto. In accordance with the invention, light emitting devices using the light emitting elements 2 through 5 can be made.

Figure 8:
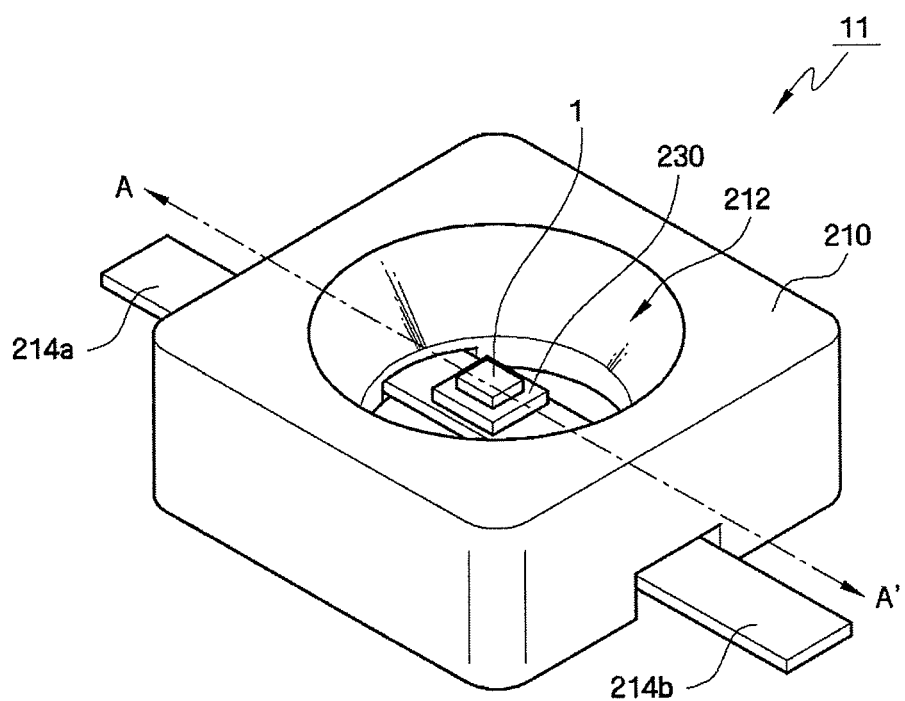
FIG. 8 is a perspective view illustrating a light emitting device according to a first exemplary embodiment of the present invention.
Figure 9A:
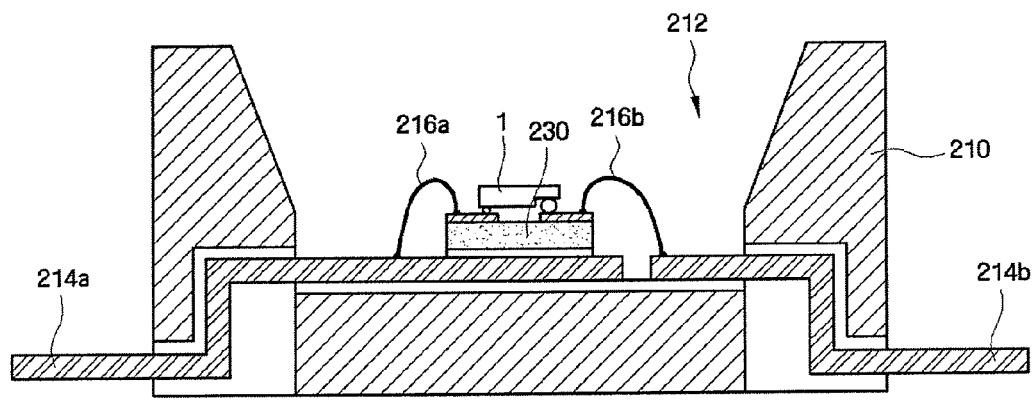
FIGS. 9A through 9C are sectional views taken along a line A-A' of FIG. 8.
Figure 9B:
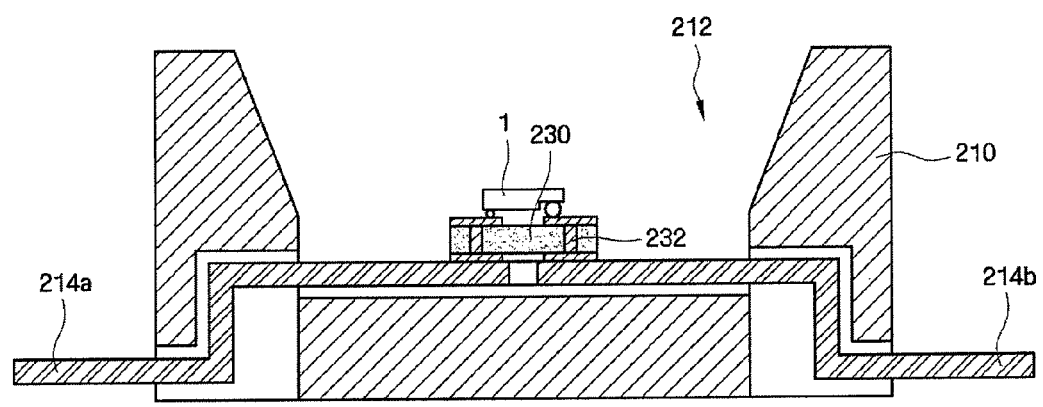
Figure 9C:
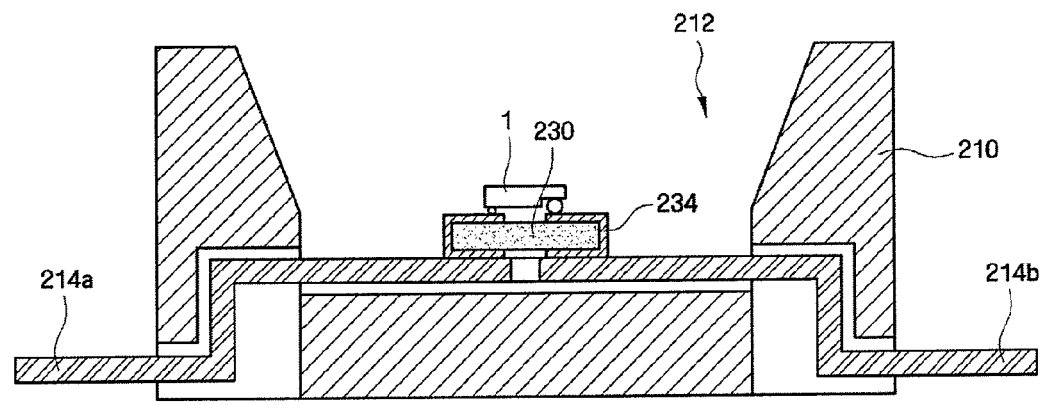

FIG. 8 is a perspective view illustrating a light emitting device according to a first exemplary embodiment of the present invention. FIGS. 9A through 9C are sectional views taken along a line A-A' of FIG. 8. Although FIGS. 9A through 9C illustrate a top view type light emitting package, the invention is not limited thereto.

First, referring to FIGS. 8 and 9A, in a light emitting device 11 according to a first exemplary embodiment of the present invention, a sub-mount 230 where a light emitting element 1 is mounted is placed on a package body 210. A slot 212 is formed in the package body 210, and the sub-mount 230 where a light emitting element 1 is mounted can be placed in the slot 212. A sidewall of the slot 212 can have a slope. Light generated in the light emitting element 1 can go forward by reflection from a sidewall. The size of the slot 212 can be determined by considering the amount of light, which is generated in the light emitting element 1, reflected from the sidewall, reflection angle, type of transparent resin that fills in the slot 212, and type of a phosphor. Also, the sub-mount 230 can be placed in the middle of the slot 212. If the distances between the light emitting element 1 and the sidewalls are the same, ununiformity of chromaticity can be prevented.

For package body 210, organic materials with superior light fastness including silicon resin, epoxy resin, acrylic resin, urea resin, fluoro resin, and imide resin or inorganic materials with light fastness including glass and silica gel can be used. Also, in order to prevent resin from melting by heat during fabrication processes, thermo-setting resin can be used. Also, in order to relieve temperature stress of resin, various fillers including oxide aluminum or such compound can be mixed. Also, the package body 210 is not limited to resin. Ceramic or metal materials can be used for part (for example, a sidewall) of the package body 210 or the entire package body 210. For example, when metal is used for the entire package body 210, it is easy to discharge heat generated from the light emitting element 1.

Also, in the package body 210 leads 214a and 214b which are electrically connected to the light emitting element 1 are installed. The light emitting element 1 is electrically connected to the sub-mount 230, and the sub-mount 230 and the leads 214a and 214b can be connected through one or more vias. Also, materials having high heat conductivity can be used as the leads 214a and 214b since heat generated from the light emitting element 1 can be discharged through the leads 214a and 214b.

Although not illustrated in the drawing, at least a part of the slot 212 can be filled with a transparent resin layer. Also, phosphor can be formed on the transparent resin layer. Alternatively, the transparent resin layer and phosphor can be mixed together. Such application methods are illustratated in FIGS. 12 through 14. For example, using the phosphor to generate white color can be achieved according to the following. If the light emitting element 1 emits blue wavelength, the phosphor can include yellow phosphor and red phosphor to improve color rendering index (CRI). Also, if the light emitting element 1 emits UV wavelength, the phosphor can include all of RGB (Red, Green, and Blue).

The difference between the light emitting device illustrated in FIG. 9B and the light emitting device illustrated in FIG. 9A is that in the light emitting device illustrated in FIG. 9B the sub-mount 230 and the leads 214a, 214b are not connected through wires (216a, 216b in FIG. 3A) and connected though via 232 installed in the sub-mount 230.

The difference between the light emitting device illustrated in FIG. 9C and the light emitting device illustrated in FIG. 9A is that in the light emitting device illustrated in FIG. 9C the sub-mount 230 and the leads 214a and 214b are not connected through wires 216a and 216b in FIG. 3A and are connected though an interconnection 234 installed along a top, a side, and a bottom.

Figure 10:
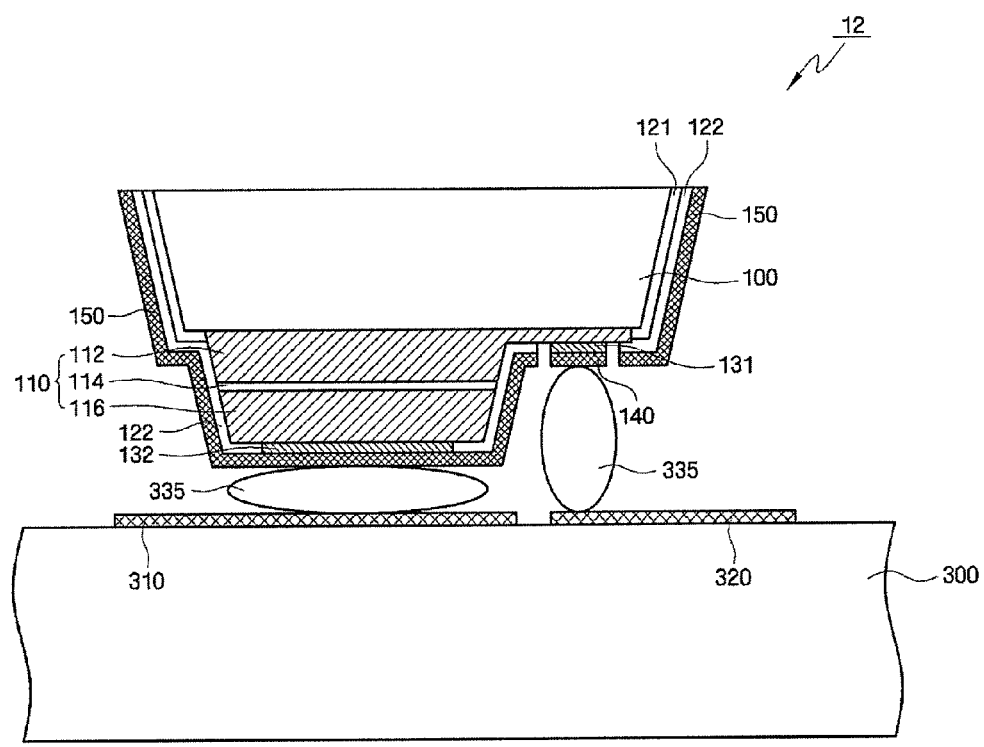
FIG. 10 is a sectional view illustrating a light emitting device according to a second exemplary embodiment of the present invention.
Figure 11:
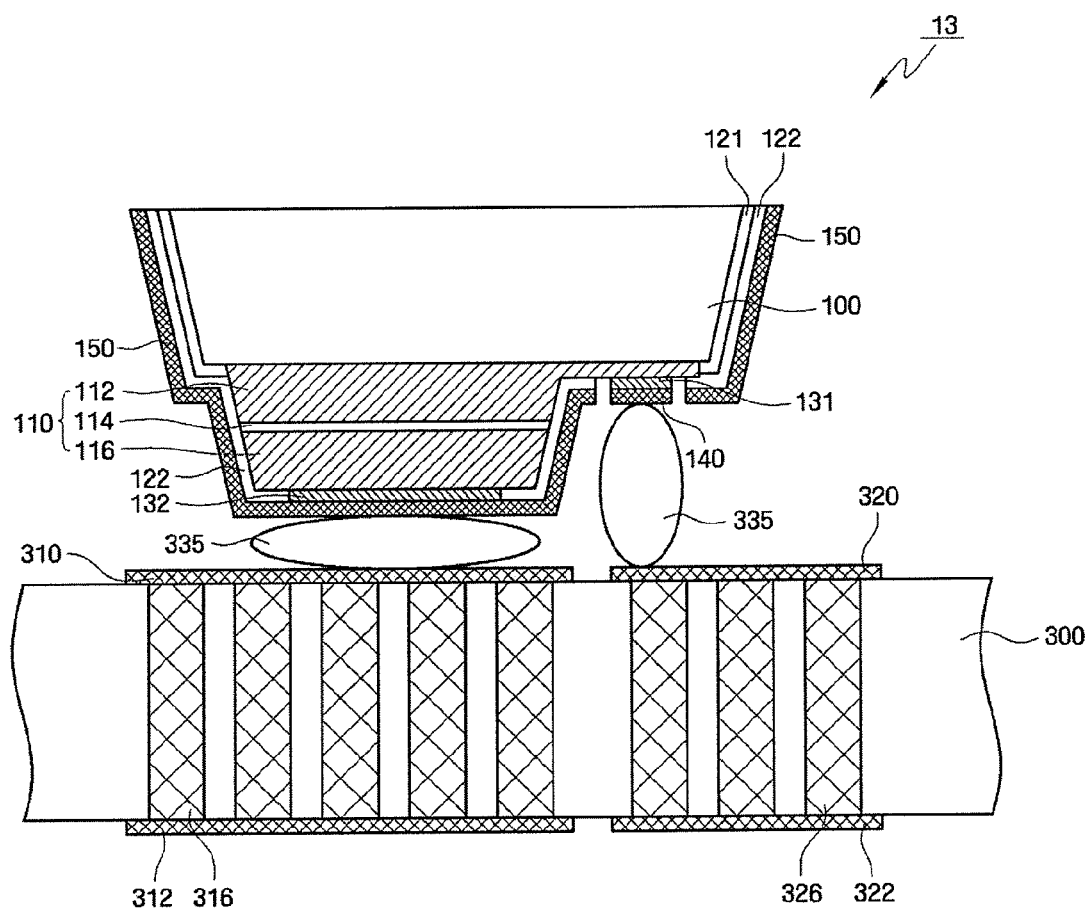
FIG. 11 is a sectional view illustrating a light emitting device according to a third exemplary embodiment of the present invention.

FIGS. 10 and 11 are vertical views illustrating light emitting devices according to second and third exemplary embodiments of the present invention. Referring FIGS. 10 and 11, connection relationships between a light emitting element according to exemplary embodiments of the present invention and a circuit substrate are described.

First, referring to FIG. 10, a light emitting device 12 according to a second exemplary embodiment of the present invention includes a circuit substrate 300 and a light emitting element 1 placed on the circuit substrate 300.

The circuit substrate 300 includes a first wire 320 and a second wire 310, which are electrically isolated from each other. The first wire 320 and the second wire 310 are placed on one side of the circuit substrate 300.

Since the light emitting element 1 is a flip chip type, it is mounted on the circuit board 300 upside down. The first wire 320 is electrically connected to a first electrode 140 of the light emitting element 1 through a conductive resin 335, and the second wire 310 is electrically connected to a second electrode 150 of the light emitting element 1 through the conductive resin 335.

Referring to FIG. 11, the difference between a light emitting device 13 according to the third exemplary embodiment of the present invention and the second exemplary embodiment is that in the light emitting device 13 according to the third exemplary embodiment a circuit substrate 300 includes through vias 316 and 326.

Specifically, on one side of the circuit substrate 300 a first wire 320 and a second wire 310 which are electrically isolated from each other are formed, and on the other side of circuit substrate 300 a third wire 322 and a fourth wire 312 which are electrically isolated from each other are formed. The first wire 320 and the third wire 322 are connected through the first through via 326, and the second wire 310 and the fourth wire 312 are connected through the second through via 316.

Figure 12:
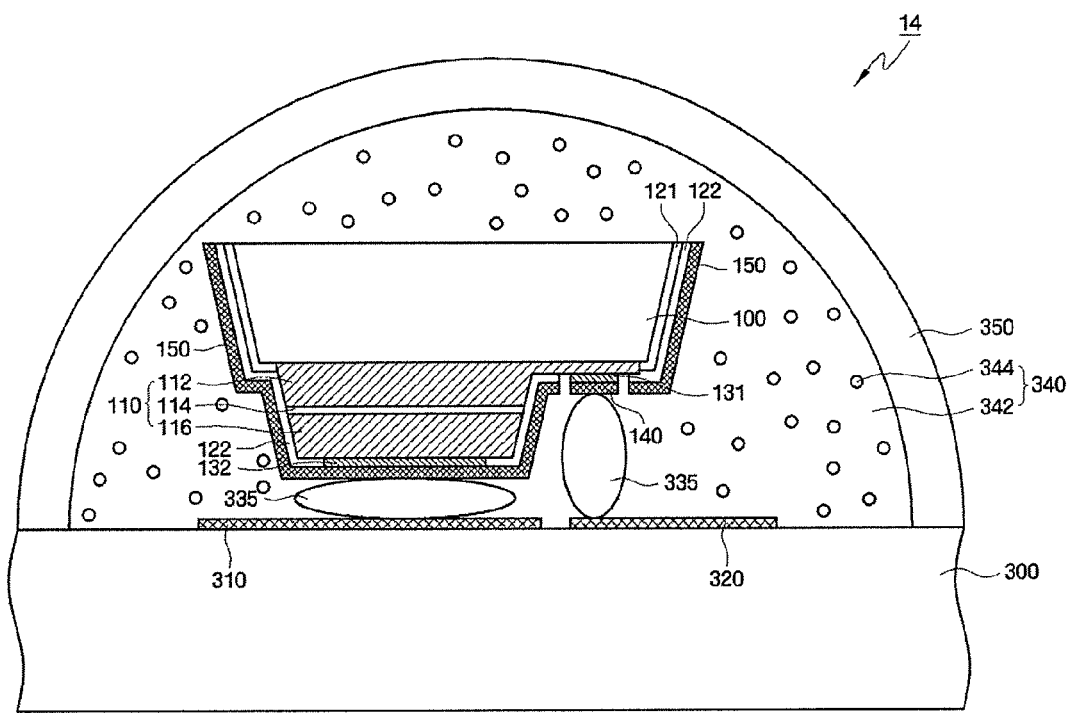
FIG. 12 is a sectional view illustrating a light emitting device according to a fourth exemplary embodiment of the present invention.

FIG. 12 is a sectional view illustrating a light emitting device according to a fourth exemplary embodiment of the present invention.

Referring to FIG. 12, a difference between a light emitting device 14 according to the fourth exemplary embodiment of the present invention and the second exemplary embodiment is that the light emitting device 14 according to the fourth exemplary embodiment includes a phosphorescence layer 340 that surrounds a light emitting element 1 and a second transparent resin 350 that surrounds the phosphorescence layer 340.

The phosphorescence layer 340 can be a mixture of a first transparent resin 342 and a phosphor 344. Since the phosphor 344 distributed in the phosphorescence layer 340 absorbs light generated from the light emitting element 1 and converts the absorbed light into light with a different wave length, light emitting characteristics can be further improved with better distribution of the phosphor 344. In this case, wave length change and color mixing effect due to the phosphor 344 can be improved.

For example, the light emitting device 14 can form the phosphorescence layer 340 to create white color. If the light emitting element 1 emits light with blue wavelength, the phosphor 344 can include yellow phosphor and also can include red phosphor to improve characteristics of color rendering index, CRI. Also, if the light emitting element 1 emits light with UV wavelength, the phosphor 344 can include all of RGB (Red, Green, and Blue).

For the first transparent resin 342 any material that can distribute the phosphor 344 stably can be used. For example, epoxy resin, silicone resin, hard silicone resin, modified silicone resin, urethane resin, oxetane resin, acrylic resin, polycarbonate resin, and polyimide resin can be used.

The phosphor 344 can be any material that can absorb light created from a light emitting structure 110 and converts the absorbed light into light with a different wavelength. For example, it can be at least one selected from the group consisting of nitride/oxynitride based phosphor mainly activated by lanthanoid series elements such as Eu and Ce, alkaline earth halogen apatite phosphor mainly activated by lanthanoid series elements such as Eu and transition metal series elements such as Mn, alkaline earth metal boron halogen phosphor, alkaline earth metal aluminate phosphor, alkaline earth silicate phosphor, Alkaline metal sulfured phosphor, alkaline earth thiogallate phosphor, alkaline earth silicon nitride phosphor, germanate, rare earth aluminate mainly activated by lanthanoid series elements such as Ce, rare earth silicate, and organic compound and organic complex mainly activated by lanthanoid elements such as Eu. The following phosphors can be used for specific examples, but the invention is not limited thereto.

Nitride based phosphor mainly activated by lanthanoid series elements such as Eu and Ce can be $M_2Si_5N_8$:Eu (M is at least one selected from the group consisting of Sr, Ca, Ba, Mg, and Zn). Also, the nitride phosphor mainly activated by lanthanoid series elemenst such as Eu and Ce can be $M2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (M is at least one selected from the group consisting of Sr, Ca, Ba, Mg, and Zn).

Oxynitride based phosphor mainly activated by lanthanoid series elements such as Eu and Ce can be $MSi_2O_2N_2$:Eu (M is at least one selected from the group consisting of Sr, Ca, Ba, Mg, and Zn).

Alkaline earth halogen apatite phosphor mainly activated by lanthanoid series elements such as Eu and transition metal series element such as Mn can be Oxynitride phosphor mainly activated by lanthanoid series elements such as Eu and Ce can be $M_5(PO_4)_3$ X:R (M is at least one selected from the group of Sr, Ca, Ba, Mg, and Zn, X is at least one selected from the group consisting of F, Cl, Br, and I, and R is at least one selected from the group consisting of Eu, Mn, and Eu)

Alkaline earth metal boron halogen phosphor can be $M_2B_5O_9X:R$ (M is at least one selected from the group consisting of Sr, Ca, Ba, Mg, and Zn, X is at least one selected from the group consisting of F, Cl, Br, and I, R is at least one selected from the group of Eu and Mn.)

Alkaline earth metal aluminate phosphor can be $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one selected from the group consisting of Eu and Mn).

Alkaline metal sulfured phosphor can be $La_2O_2S$:Eu, $Y_2O_2S$:Eu, $Gd_2O_2S$:Eu, and so on.

Rare earth aluminate phosphor mainly activated by lanthanoid series elements such as Ce can be YAG series phosphor such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Also, $Tb_3Al_5O_{12}$:Ce, $Lu_3Al_5O_{12}$:Ce, and so on whose part or whole is substitute with Tb or Lu can be used.

Alkaline earth silicate phosphor can include silicate and for example, $(SrBa)_2SiO_4$:Eu can be used.

In addition, ZnS:Eu, $Zn_2GeO_4$:Mn, and $MGa_2S_4$:Eu (M is one selected from the group consisting of Sr, Ca, Ba, Mg, and Zn and X is one selected from the group consisting of F, Cl, Br, and I).

The phosphor described previously can include at least one selected from the group consisting of Tb, Cu, Ag, Au, Cr, Nd, Dy, Co, Ni, and Ti instead of Eu or in addition to Eu.

Also, a phosphor other than the phosphors described previously that has the same performance and effects can be used.

The second transparent resin 350 has a shape of a lens and diffuses light created from the light emitting element 1. By controlling curvature and flatness of the second transparent resin 350, diffusion/extraction characteristics can be controlled. Also, the second transparent resin 350 is formed to surround the phosphorescence layer 340 and can protect the phosphorescence layer 340. In a humid condition, the characteristics of phosphor 344 can be degraded.

Any material that allows light penetration can be used as the second transparent resin 350. For example, epoxy resin, silicone resin, hard silicone resin, modified silicone resin, urethane resin, oxetane resin, acrylic resin, polycarbonate resin, and polyimide can be used.

Figure 13:
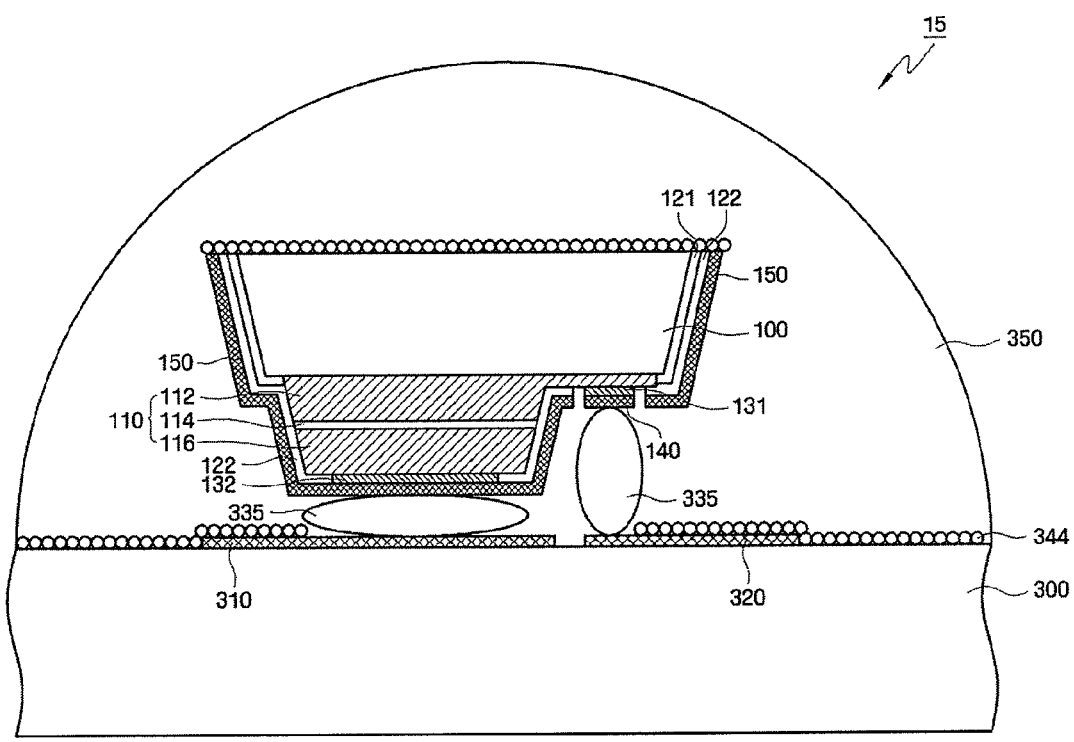
FIG. 13 is a sectional view illustrating a light emitting device according to a fifth exemplary embodiment of the present invention.

FIG. 13 is a sectional view illustrating a light emitting device according to a fifth exemplary embodiment of the present invention.

Referring to FIG. 13, in a light emitting device 15 according to a fifth exemplary embodiment of the present invention a phosphor 344 is formed along profiles of a light emitting element 1 and a circuit substrate 300.

In this case, the phosphor 344 can be applied without an extra first transparent resin (refer to 342 in FIG. 12).

In a case where the phosphor 344 is applied without the extra first transparent resin, the transparent resin that surrounds the light emitting element 1 is a single layer (i.e., single layer of 350 without 342).

Figure 14:
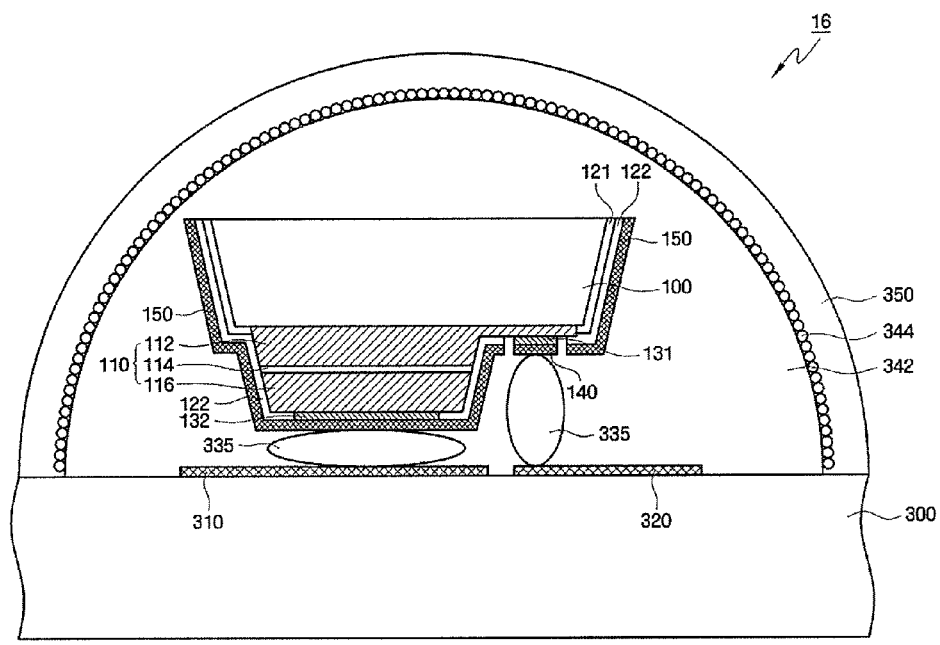
FIG. 14 is a sectional view illustrating a light emitting device according to a sixth exemplary embodiment of the present invention.

FIG. 14 is a sectional view illustrating a light emitting device according to a sixth exemplary embodiment of the present invention.

Referring to FIG. 14, a light emitting device 16 according to the sixth exemplary embodiment of the present invention is different from the fourth exemplary embodiment such that the light emitting device 16 according to the sixth exemplary embodiment includes a first transparent resin 342 that surrounds a light emitting element 1, a phosphor 344 formed on the first transparent resin 342, and a second transparent resin 350 formed on the phosphor 344.

Since the first transparent resin 342 and the phosphor 344 are not applied mixed together but are applied separately, the phosphor 344 can be formed thinly and conformally along the surface of the first transparent resin 342.

Figure 15:
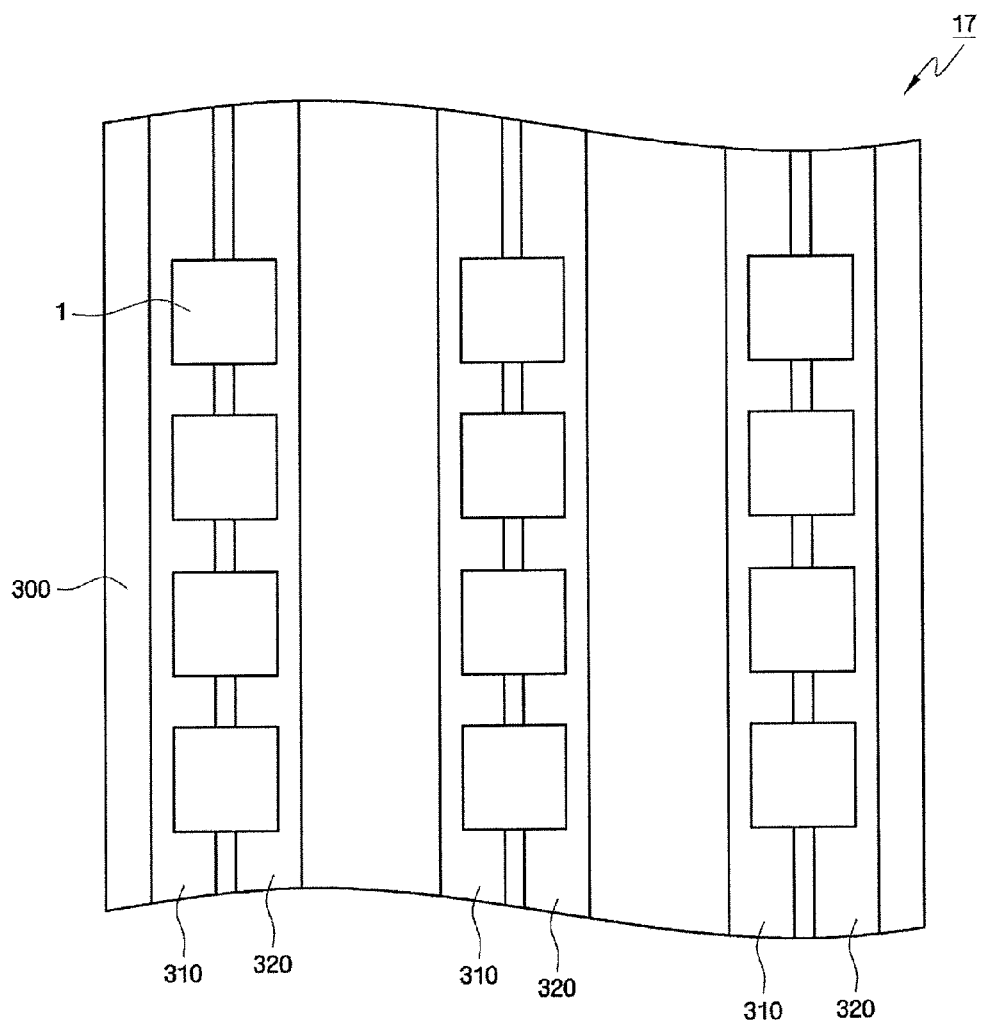
FIGS. 15 through 16B are plane and perspective views illustrating a light emitting device according to a seventh exemplary embodiment of the present invention.
Figure 16A:
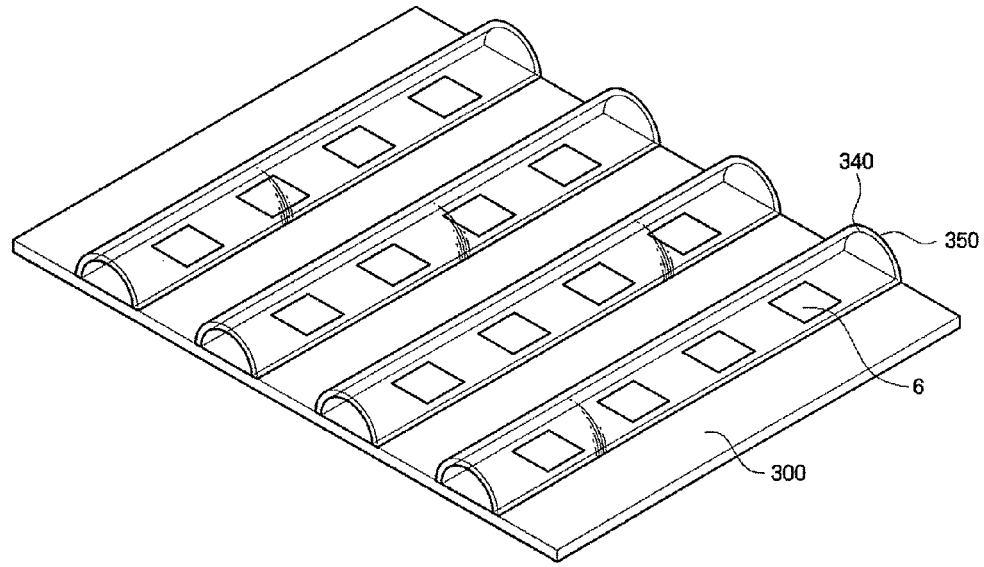
Figure 16B:
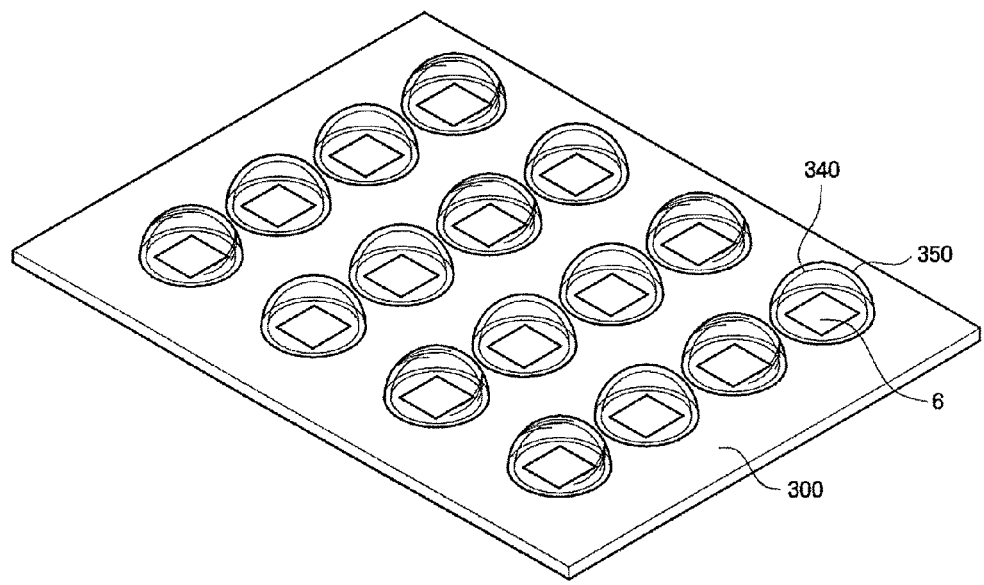

FIGS. 15 through 16B are drawings illustrating a light emitting device according to a seventh exemplary embodiment of the present invention. Specifically, FIGS. 15 through 16B are drawings illustrating a light emitting element array where multiple light emitting elements are placed on a circuit substrate. In particular, FIGS. 16A and 16B are drawings illustrating a shape where a phosphorescence layer 340 and a second transparent resin 350 are formed on the light emitting element array.

First, referring to FIG. 15, on a circuit substrate 300, a first wire 320 and a second wire 310 extend in one direction in parallel. A light emitting element 1 is placed on the first wire 320 along the extended direction of the first wire 320. When a first bias is applied to the first wire 320 and a second bias is applied to the second wire 310, a forward bias is applied to a light emitting structure (not shown) inside the light emitting element 1 and the light emitting element 1 emits light.

Here, referring to FIG. 16A, the phosphorescence layer 340 and the second transparent resin 350 can be formed in a line type. For example, as illustrated in FIG. 15, when the light emitting element 1 is placed along the extended direction of the first wire 320, the phosphorescence layer 340 and the second transparent resin 350 can be placed along the extended direction of the first wire 320. Also, the phosphorescence layer 340 and the second transparent resin 350 can be formed such that they surround both the first wire 320 and the second wire 310.

Referring to FIG. 16B, the phosphorescence layer 340 and the second transparent resin 350 can be formed in a dot type. Each of the phosphorescence layers 340 and each of the second transparent resin 350 can be formed such that they surround only the corresponding light emitting element 1.

Figure 17:
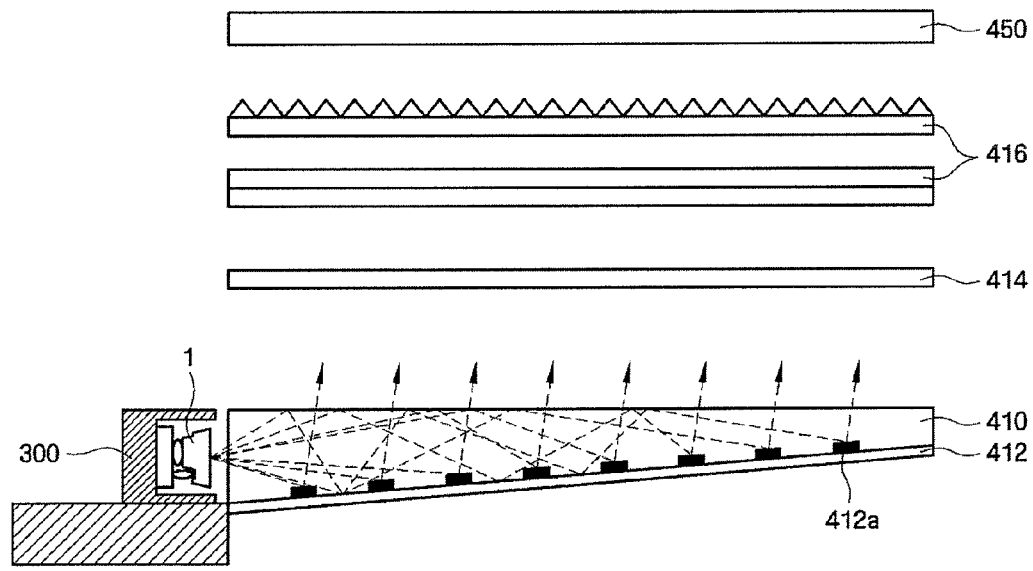
FIG. 17 is a sectional view illustrating a light emitting device according to an eighth exemplary embodiment of the present invention.

FIG. 17 is a sectional view illustrating a light emitting device according to an eighth exemplary embodiment of the present invention.

FIG. 17 illustrates a light emitting device according to the eighth exemplary embodiment of the present invention, which is an end product. The light emitting device according to the exemplary embodiments of the present invention can be used in various devices including light device, display device, mobile device (cellular phone, MP3 player, navigation, and so on). The exemplary device illustrated in FIG. 17 is an edge type BLU (Back Light Unit) used in LCD (Liquid Crystal Display). Since LCD does not include a self light source, BLU is used as a light source and BLU mainly emits light from a back of a LCD panel.

Referring to FIG. 17, the BLU includes a light emitting element 1, a light guide panel 410, a reflection panel 412, a diffusion sheet 414, and a pair of prism sheets 416.

The light emitting element 1 provides light. Here, the light emitting element 1 used can be a side view type light emitting element.

The light guide panel 410 guides light supplied to a liquid crystal panel 450. The light guide panel 410 is formed with transparent material such as acrylic resin which is a series of plastic, and it moves light created from a light emitting device toward the liquid crystal panel 450 placed on the light guide panel 410. Thus, on a rear side of the light guide panel 410 various kinds of patterns 412a are printed to change movement direction of light entering the light guide panel 410 toward the liquid crystal panel 450.

The reflection panel 412 is installed on a bottom side of the light guide panel 410 and reflects light discharged to the bottom of the light guide panel 410 to an upper side. The reflection panel 412 reflects light which is not reflected by the various kinds of patterns 412a toward an output face of the light guide panel 410. As a result, light loss is reduced and uniformness of light that penetrates the output face of the light guide panel 410 is improved.

The diffusion sheet 414 diffuses light that comes out of the light guide panel 410 and prevents light from partial congestion.

On the prism sheet 416 prisms in triangular shape are formed in a uniform arrangement. Typically, the prism sheet 416 consists of two sheets, and the prism arrangements are placed to be crossed with respect to each other at a predetermined angle and allow light diffused from the diffusion sheet 414 to move vertically to the liquid crystal panel 450.

FIGS. 18 through 21 are drawings illustrating a light emitting device according to ninth through twelfth exemplary embodiments of the present invention.

Figure 18:
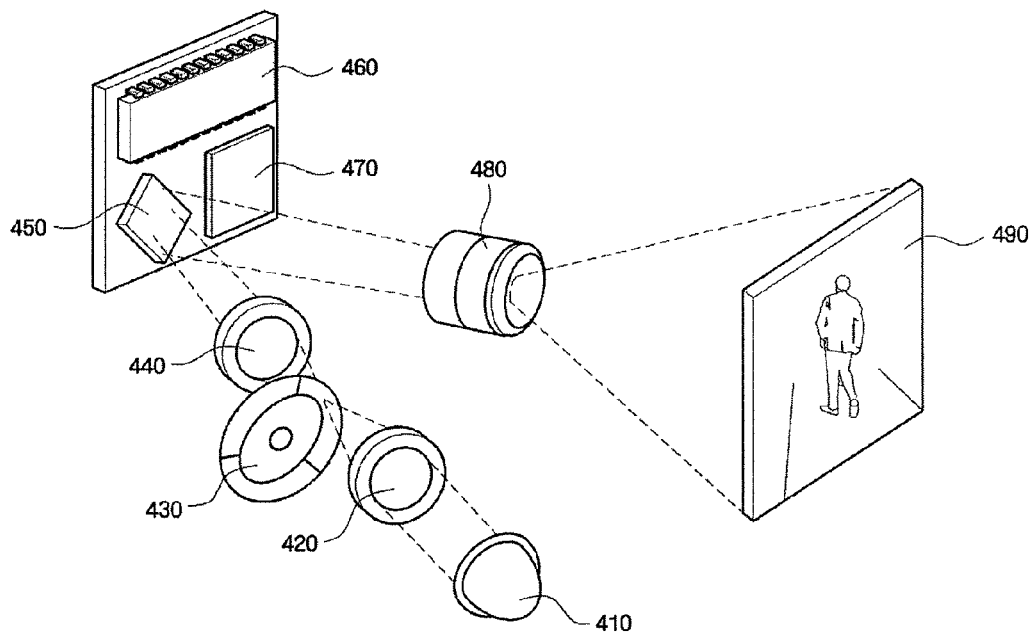
FIGS. 18 through 21 are drawings illustrating light emitting devices according to ninth through twelfth exemplary embodiments of the present invention.
Figure 19:
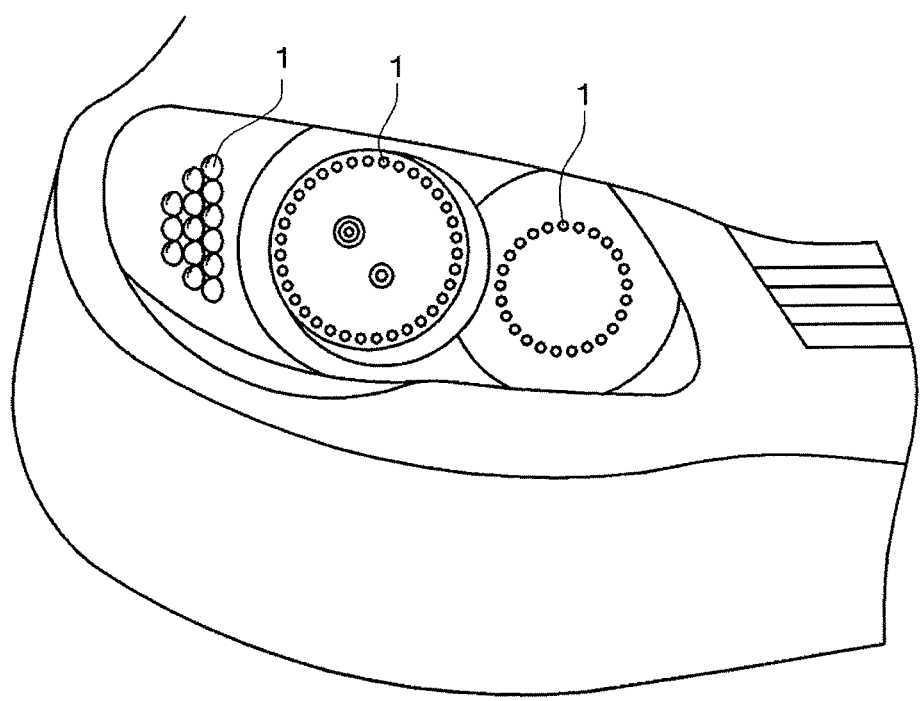
Figure 20:
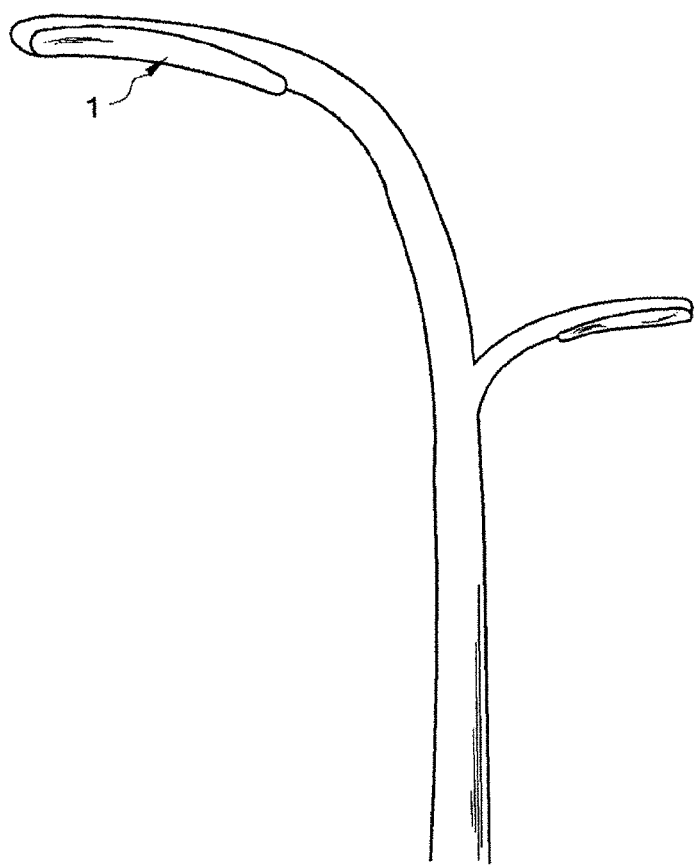
Figure 21:
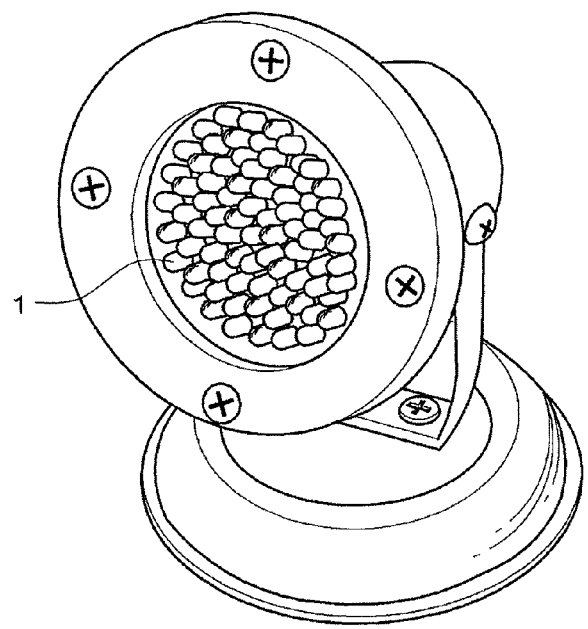

FIGS. 18 through 21 illustrate exemplary devices (end products) according to the previously described light emitting device. FIG. 18 illustrates a projector. FIG. 19 illustrates a headlight of an automobile. FIG. 20 illustrates a streetlight. FIG. 21 illustrates a light lamp. The light emitting element 1 used in FIGS. 18 through 21 can be a top view type light emitting element.

Referring to FIG. 18, light from a light source 410 passes a condensing lens 420, a color filter 430 and a shaping lens 440, reflected by a DMD (digital micro-mirror device) 450, passes a projection lens 480, and arrives at a screen 490. Inside the light source 410, the light emitting element according to the present invention is installed.

FIGS. 22 through 26 are sectional views illustrating steps of a fabrication method of a light emitting element according to the first exemplary embodiment of the present invention.

Figure 22:
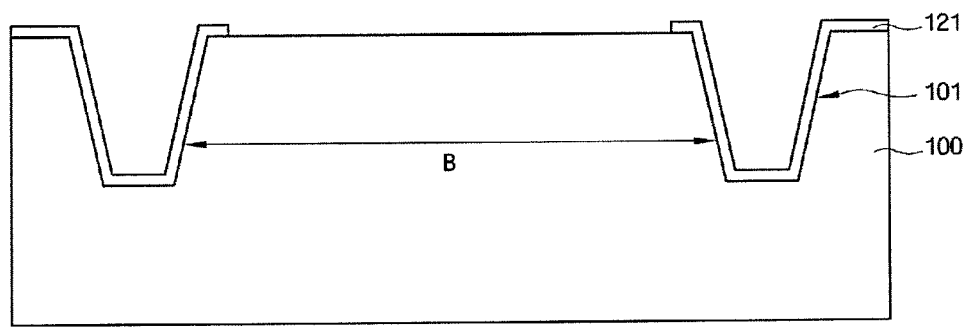
FIGS. 22 through 26 are sectional views illustrating steps of a fabrication method of a light emitting device according to the first exemplary embodiment of the present invention.

First, referring to FIG. 22, by forming a groove 101 in a substrate 100 a device formation region B is defined. Specifically, to form the groove 101 in the substrate 100, for example, at least one selected from the group consisting of dicing equipment, a diamond tip, laser, or ICP RIE (Inductively Coupled Plasma Reactive Ion Etching) can be used. Such groove 101, as illustrated, can be in a U shape or a V shape. Thus, the sidewall of the groove 101 can have a slope.

Next, by forming a first dielectric layer 121 on the groove 101 and the device isolation region B and etching part of the first dielectric layer 121, part of the device formation region B can be exposed.

Figure 23:
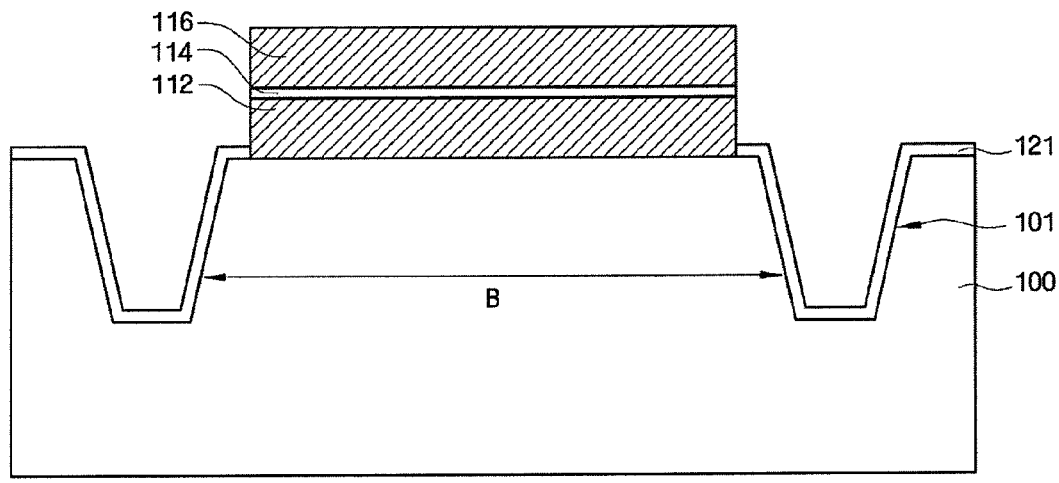

Referring to FIG. 23, a first conductive layer 112, a light emitting layer 114, a second conductive layer 116 are formed sequentially on the exposed device formation region B.

Specifically, the first conductive layer 112, the light emitting layer 114, and the second conductive layer 116 can include $In_xAl_yGa_{(1-x-y)}N$ ($0 \leq x \leq 1$, $0 \leq y \leq 1$). Thus, the first conductive layer 112, the light emitting layer 114, and the second conductive layer 116 can be, for example, AlGaN or InGaN. The first conductive layer 112 of a first conductivity type, the light emitting layer 114, and the second conductive layer 116 of a second conductivity type can be grown by using MOCVD (metal organic chemical vapor deposition), liquid phase epitaxy, hydride vapor phase epitaxy, molecular beam epitaxy, MOVPE (metal organic vapor phase epitaxy), and so on.

In particular, the first conductive layer 112, the light emitting layer 114, and the second conductive layer 116 can be grown along the shape of the exposed device formation region B.

Thus, if the exposed device formation region B is in a rectangular shape, the first conductive layer 112, the light emitting layer 114, and the second conductive layer 116 can be grown in square pillar shape (rectangular parallelepiped), as illustrated in FIG. 2. If the exposed device formation region B is in a circle shape, they can be grown in cylinder shape, as illustrated in FIG. 5.

As described above, the growing method according to the shape of the exposed device formation region B can reduce the damage or stress of the first conductive layer 112, the light emitting layer 114, and the second conductive layer 116. For example, the method that grows the first conductive layer 112, the light emitting layer 114, and the second conductive layer 116 using the device formation region B exposed in circle shape can introduce less damage or stress compared to a method that first grows the first conductive layer 112, the light emitting layer 114, and the second conductive layer 116 and then performs etching in cylinder shape using a mask.

Figure 24:
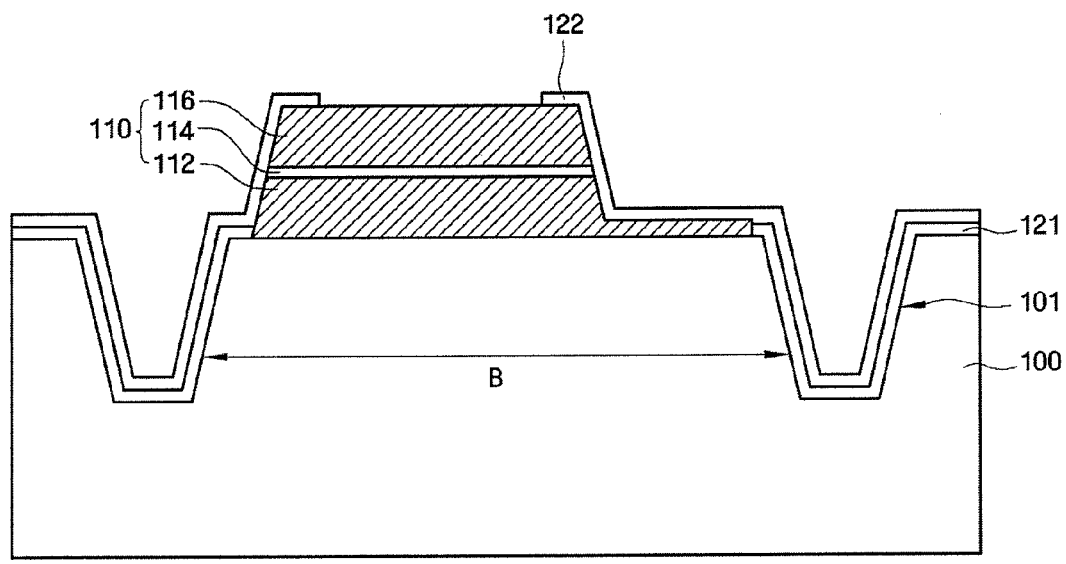

Referring to FIG. 24, a part of the second conductive layer 116, a part of the light emitting layer 114, and a part of the first conductive layer 112 are patterned. As a result, the width of the first conductive layer 112 becomes wider than the width of the second conductive layer 116, and a part of the first conductive layer 112 can protrude (i.e., the first conductive layer 112 can protrude compared to the second conductive layer 116 or the light emitting layer 114.). Here, a light emitting structure 110 can have a side slope since the bottom width is wider than the top width. In this step, although forming a square pillar shape growth as illustrated in FIG. 23 and etching as illustrated in FIG. 24 are shown as a method used to form a slope on the sidewall of the light emitting structure 110, the invention is not limited thereto. For example, by adjusting a growth condition in the step of FIG. 23, square pillar shape having side slope can be formed.

Next, a second dielectric layer 122 is formed on the light emitting structure 110 including the second conductive layer 116, the light emitting layer 114, the first conductive layer 112 and the first dielectric layer 121.

Then, the second dielectric layer 122 is patterned and a part of the second dielectric layer 122 is removed. As a result, a part of the second conductive layer 116 is exposed.

Figure 25:
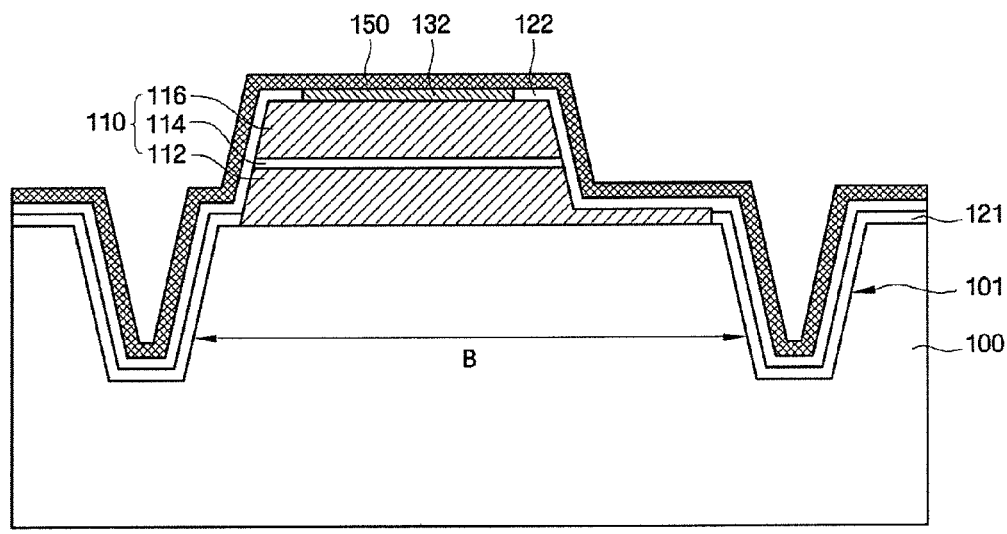

Referring to FIG. 25, a second ohmic layer 132 is formed on the exposed second conductive layer 116.

Next, a second electrode 150 which is electrically connected to the second ohmic layer 132 is formed. In this step, the second electrode 150 can be formed from the top of the light emitting structure 110, along the sidewall of light emitting structure 110, and to the sidewall of groove 101. The sidewall of the light emitting structure 110 and the sidewall of groove 100 have slope, and the second electrode 150 is formed conformally along the light emitting structure 110 and the groove 101. As a result, a part of the second electrode 150 can have a slope and be inclined.

Figure 26:
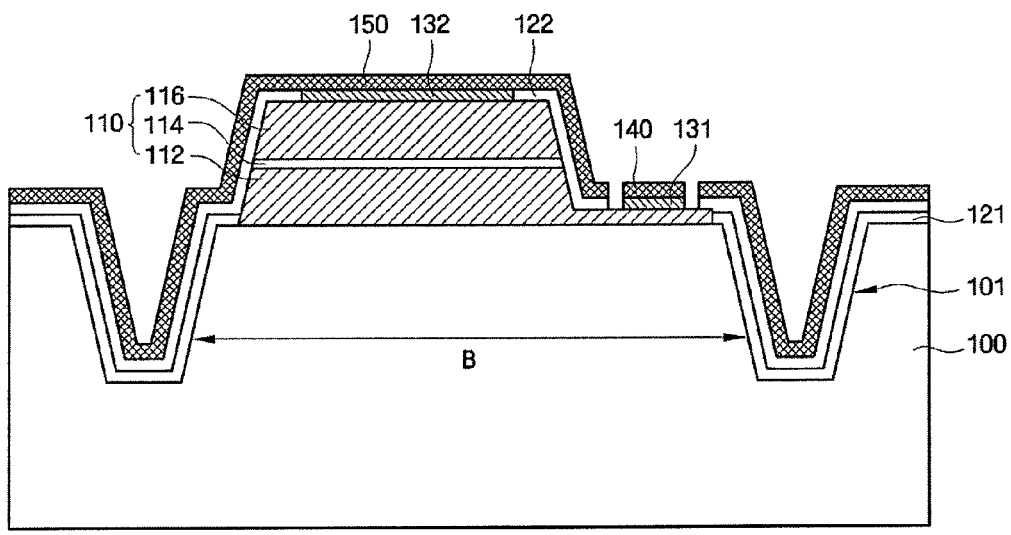

Referring to FIG. 26, by removing a part of the second electrode 150, a part of the projected area of the first conductive layer 112 is exposed.

Next, on the exposed first conductive layer 112 a first ohmic layer 131 and a first electrode 140 which are electrically connected to the first conductive layer 112 are formed sequentially. Here, it is not mandatory to form the first ohmic layer 131.

Referring to FIG. 2 again, the elements are separated into chip units at the grooves such that formation of the light emitting element 1 is completed.

In a mehod of fabricating the light emitting element according to the first exemplary embodiment of the present invention, although a grinding process can be used to separate elements into chip units, the invention is not limited thereto. For example, a grinding process and a chipping process can be used simultaneously. Also, only a chipping process can be used.

Assuming separating into the chip units only by the grinding process, if the side where the light emitting structure 110 is formed is defined as one side, chip unit separation can be done by performing grinding from the other side of the substrate to the groove 101. In this case, the other side of the substrate 100 and part of the second electrode 150 can be placed on the same plane P.

Figure 27:
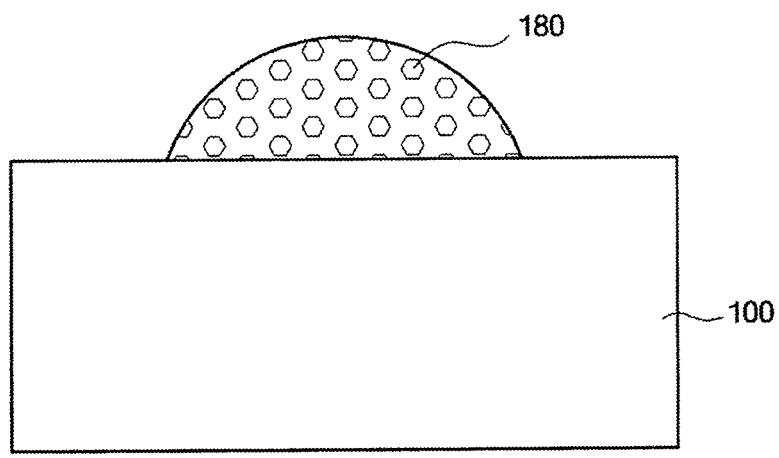
FIGS. 27 and 28 are sectional views illustrating steps of a fabrication method of a light emitting device according to the fourth exemplary embodiment of the present invention.
Figure 28:
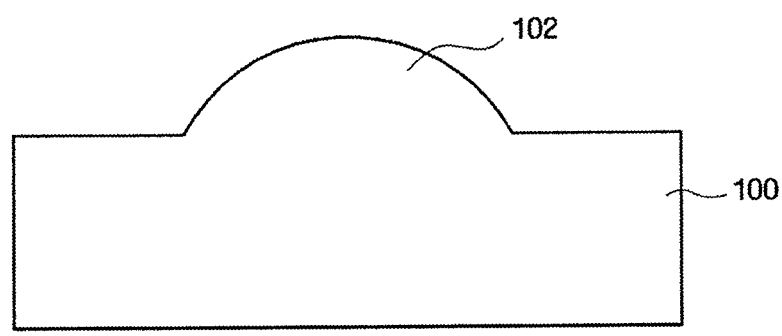

FIGS. 27 and 28 are sectional views illustrating steps in a fabrication method of a light emitting device according to the fourth exemplary embodiment of the present invention.

Referring to FIG. 27, a mask pattern 180 in a convex dome shape is formed on a substrate 100.

Specifically, a cylinder shaped mask layer is formed on the substrate 100 and the substrate 100 where the mask layer is formed is treated with high temperature to form the convex shaped mask pattern 180. Here, the mask pattern 180, for example, can be photo resist.

Referring to FIG. 28, a dome pattern 102 is formed on the substrate 100 by etching the substrate using the convex dome shaped mask pattern 180.

The subsequent processes are skipped since they can be described identically using FIGS. 22 through 26 and FIG. 2.

FIGS. 29 through 32 are sectional views illustrating steps in a fabrication method of a light emitting device according to the fifth exemplary embodiment of the present invention.

Figure 29:
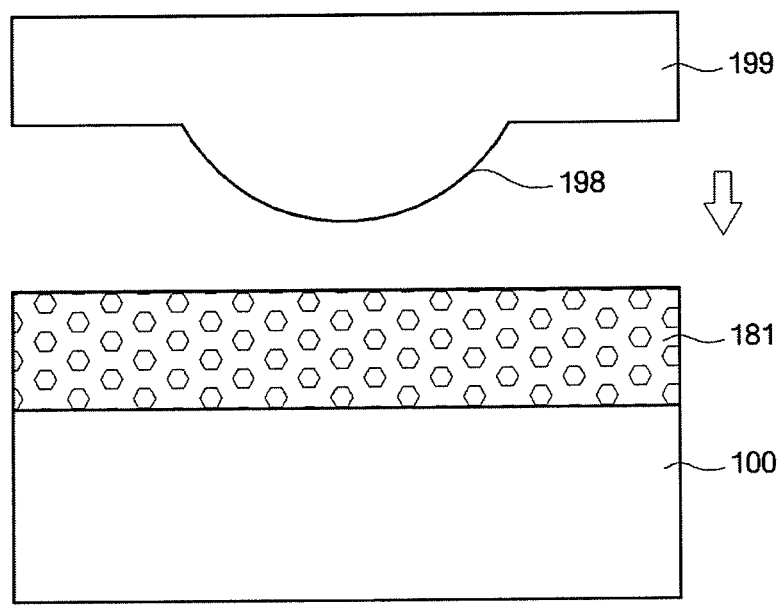
FIGS. 29 through 32 are sectional views illustrating steps of a fabrication method of a light emitting device according to the fifth exemplary embodiment of the present invention.

Referring to FIG. 29, a mask layer 181 is formed on a substrate 100. The mask layer 181, for example, can be photoresist.

A concave dome pattern 182 is formed in the mask layer 181 with a tool 199 where the convex dome pattern 198 is formed.

Figure 30:
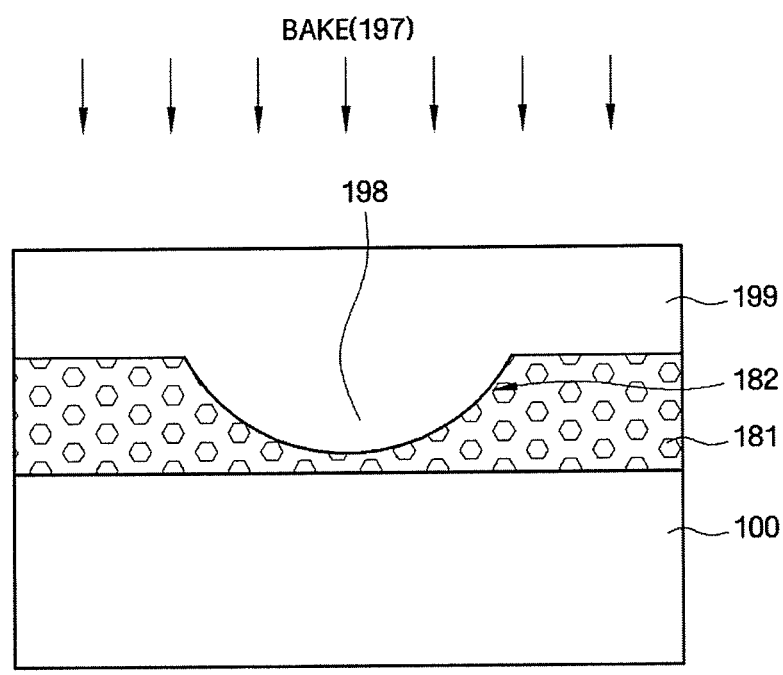

Specifically, as illustrated in FIG. 30, the mask layer 181 is pressed by the tool 199 where the convex dome pattern 198 is formed. Since the mask layer 181 is pressed by the tool 199 where the convex dome pattern 198 is formed, the concave dome pattern 182 is formed in the mask layer 181.

As illustrated in FIG. 30, the mask layer 181 where the concave dome pattern 182 is formed is hardened by a bake 197.

Depending on the fabrication method, the bake 197 can be omitted.

Figure 31:
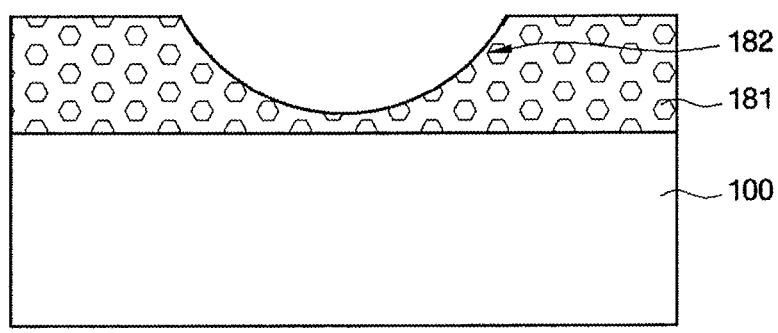

As illustrated in FIG. 31, the tool 199 where the convex dome pattern 198 is formed is separated from the mask layer 181.

Figure 32:
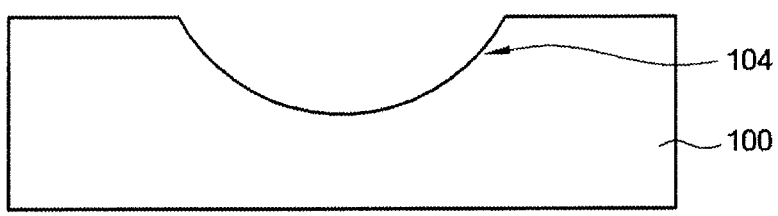

Referring to FIG. 32, by using the mask layer 181 where the concave dome pattern 182 is formed, the substrate 100 is etched. Thus, a concave pattern 104 is formed in the substrate 100.

The subsequent processes are the same as those described in connection with FIGS. 22 through 26 and FIG. 2. Therefore, detailed description thereof will not be repeated.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A light emitting element comprising:
a substrate including sidewalls having a slope;
a light emitting structure including a first conductive layer of a first conductivity type, a light emitting layer, and a second conductive layer of a second conductivity type which are sequentially stacked;
a dielectric layer conformally foamed on the sidewalls of the substrate;
a first electrode electrically connected to the first conductive layer; and
a second electrode electrically connected to the second conductive layer and spaced apart from the first electrode,
wherein the dielectric layer overlaps a portion of at least one sidewall of the light emitting structure, and
wherein the dielectric layer overlaps the first conductive layer without overlapping the second conductive layer.

2. The light emitting element of claim 1, further comprising a phosphorescence layer surrounding the light emitting structure.

3. The light emitting element of claim 2, wherein the phosphorescence layer is a mixture of a transparent resin and a phosphor.

4. The light emitting element of claim 3, wherein the transparent resin includes one resin selected from epoxy resin, silicone resin, hard silicone resin, modified silicone resin, urethane resin, oxetane resin, acrylic resin, poly-carbonate resin and polyimide resin.

5. The light emitting element of claim 3, wherein the phosphor is at least one selected from the group comprising nitride/oxynitride phosphor, alkaline earth halogen apatite phosphor, alkaline earth metal boron halogen phosphor, alkaline earth metal aluminate phosphor, alkaline earth silicate, alkaline earth sulfide, alkaline earth thiogallate, alkaline earth silicon nitride, germanate, rare earth aluminate, rare earth silicate, organic compound and organic complex and combinations thereof.

6. The light emitting element of claim 2, further comprising a transparent resin surrounding the phosphorescence layer.

7. The light emitting element of claim 6, wherein the transparent resin comprises one resin selected from epoxy resin, silicone resin, hard silicone resin, modified silicone resin, urethane resin, oxetane resin, acrylic resin, poly-carbonate resin and polyimide resin.

8. The light emitting element of claim 6, wherein the transparent resin is lens-shaped.

9. The light emitting element of claim 1, further comprising a phosphor formed along a profile of the substrate.

10. The light emitting element of claim 9, further comprising a transparent resin surrounding the phosphor and the light emitting structure.

11. The light emitting element of claim 1, wherein the width of the first conductive layer is larger than the width of the second conductive layer and the width of the light emitting layer.

12. The light emitting element of claim 1, further comprising a supporting substrate having a first surface, a second surface opposite the first surface, a first through via and a second through via,
wherein the first through via and the second through via extend through the support substrate from the first surface to the second surface, and
wherein the light emitting structure is attached to the first surface of the support substrate, and wherein the first electrode is electrically connected to the first through via, and the second electrode is electrically connected to the second through via.

13. The light emitting element of claim 12, wherein the first electrode and the second electrode face the first surface of the supporting substrate.

14. The light emitting element of claim 13, further comprising a first conductive resin and a second conductive resin, wherein the first conductive resin connects the first electrode to the first through via, and the second conductive resin connects the second electrode to the second through via.

15. The light emitting element of claim 12, further comprising a first conductive region and a second conductive region electrically isolated from the first conductive region, wherein the first conductive region and the second conductive region are on the second surface of the supporting substrate, and wherein the first conductive region is connected with the first through via, and the second conductive region is connected with the second through via.

16. A light emitting element comprising:

a substrate including sidewalls having a slope;

a light emitting structure including a first conductive layer of a first conductivity type, a light emitting layer, and a second conductive layer of a second conductivity type which are sequentially stacked;

a dielectric layer conformally formed on the sidewalls of the substrate;

a first electrode electrically connected to the first conductive layer;

a second electrode electrically connected to the second conductive layer and spaced apart from the first electrode;

a phosphorescence layer surrounding the light emitting structure; and a transparent resin surrounding the phosphorescence layer.

17. The light emitting element of claim 16, wherein the transparent resin comprises one resin selected from epoxy resin, silicone resin, hard silicone resin, modified silicone resin, urethane resin, oxetane resin, acrylic resin, poly-carbonate resin and polyimide resin.

18. The light emitting element of claim 16, wherein the transparent resin is lens-shaped.

* * * * *